(12) United States Patent
Shiraiwa et al.

(10) Patent No.: US 12,291,780 B2
(45) Date of Patent: May 6, 2025

(54) TRAY AND SUBSTRATE FIXING DEVICE

(71) Applicant: SHINKO ELECTRIC INDUSTRIES CO., LTD., Nagano (JP)

(72) Inventors: Norio Shiraiwa, Nagano (JP); Kazuya Takada, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 69 days.

(21) Appl. No.: 18/506,662

(22) Filed: Nov. 10, 2023

(65) Prior Publication Data

US 2024/0158916 A1    May 16, 2024

(30) Foreign Application Priority Data

Nov. 14, 2022 (JP) ................. 2022-181706

(51) Int. Cl.
*H01L 21/683* (2006.01)
*C23C 16/458* (2006.01)
*H01L 21/687* (2006.01)

(52) U.S. Cl.
CPC ...... *C23C 16/4581* (2013.01); *C23C 16/4583* (2013.01)

(58) Field of Classification Search
CPC .......... H01L 21/6833; H01L 21/68757; H01L 21/6831; H01L 21/68771; H01L 21/67069; H01L 21/67109; H01L 21/68742; C23C 14/50; C23C 16/4581; C23C 16/4583
USPC ........................... 361/234; 206/45
See application file for complete search history.

(56) References Cited

U.S. PATENT DOCUMENTS

| | | | | |
|---|---|---|---|---|
| 2010/0002355 A1* | 1/2010 | Morooka | .......... | H01L 21/67069 361/234 |
| 2013/0048217 A1* | 2/2013 | Shiraiwa | .......... | H01J 37/32788 361/234 |
| 2015/0371885 A1* | 12/2015 | Tamagawa | .......... | H01L 21/6833 361/234 |
| 2018/0247852 A1* | 8/2018 | Shiraiwa | .......... | H01L 21/67109 |

FOREIGN PATENT DOCUMENTS

JP    2018-142589 A    9/2018

* cited by examiner

*Primary Examiner* — Luan K Bui
(74) *Attorney, Agent, or Firm* — Rankin, Hill & Clark LLP

(57) ABSTRACT

A tray mounted on an electrostatic chuck includes an accommodation recess configured to accommodate a substrate, a bottom plate portion placed on the electrostatic chuck, a coating film layer made of a material different from the bottom plate portion and formed on an upper surface of the bottom plate portion, and an opening portion penetrating the coating film layer in a thickness direction. The accommodation recess includes an inner side surface of the opening portion and an upper surface of the bottom plate portion exposed from the opening portion. The coating film layer has a multilayer structure including a first coating film having higher plasma resistance than the bottom plate portion and a second coating film laminated on an upper surface of the first coating film and having higher plasma resistance than the first coating film. The first coating film is thicker than the second coating film.

10 Claims, 17 Drawing Sheets

TRAY AND SUBSTRATE FIXING DEVICE

CROSS-REFERENCE TO RELATED APPLICATIONS

This application claims priority from Japanese Patent Application No. 2022-181706, filed on Nov. 14, 2022, the entire content of which is incorporated herein by reference.

TECHNICAL FIELD

The present invention relates to a tray and a substrate fixing device.

BACKGROUND ART

In the related art, a semiconductor device such as a light emitting diode (LED) is manufactured by performing various processes such as dry etching and chemical vapor deposition (CVD) on an insulating substrate or a semiconductor substrate. In this process, a plurality of substrates are simultaneously processed using a substrate fixing device for fixing the substrates in a chamber (see, for example, JP2018-142589A). As this type of substrate fixing device, a substrate fixing device using an electrostatic chuck has been proposed.

As illustrated in FIG. 16, a substrate fixing device 100 includes a conductive base plate 101, an electrostatic chuck 102 fixed on the base plate 101, and a tray 103 sucked to the electrostatic chuck 102. An upper surface of the tray 103 is provided with a plurality of recesses 103X for accommodating a plurality of substrates W, respectively.

SUMMARY OF INVENTION

The recess 103X of the tray 103 is formed by blasting or the like. As illustrated in FIG. 17, in the recess 103X formed by the blasting, an outer peripheral edge of the bottom portion thereof is formed in an R shape. Therefore, in order to accommodate the substrate W in the recess 103X, it is necessary to increase an opening diameter of the recess 103X by an amount corresponding to the R shape. However, when the opening diameter of the recess 103X becomes large, a problem that the substrate W moves in the recess 103X at the time of transfer or the like occurs. Further, when the substrate W moves in the recess 103X and the substrate W is placed on an R-shaped portion, the substrate W is inclined in the recess 103X, and thus there is a problem that the substrate W cannot be sucked.

According to one aspect of the present invention, there is provided a tray mounted on an electrostatic chuck, and the tray includes: an accommodation recess configured to accommodate a substrate; a bottom plate portion placed on the electrostatic chuck; a coating film layer made of a material different from the bottom plate portion and formed on an upper surface of the bottom plate portion; and an opening portion penetrating the coating film layer in a thickness direction. The accommodation recess includes an inner side surface of the opening portion and an upper surface of the bottom plate portion exposed from the opening portion, the coating film layer has a multilayer structure including a first coating film having higher plasma resistance than the bottom plate portion and a second coating film laminated on an upper surface of the first coating film and having higher plasma resistance than the first coating film, and the first coating film is thicker than the second coating film.

According to one aspect of the present invention, there is an effect that the substrate can be suitably fixed.

DESCRIPTION OF EMBODIMENTS

Figure 1:
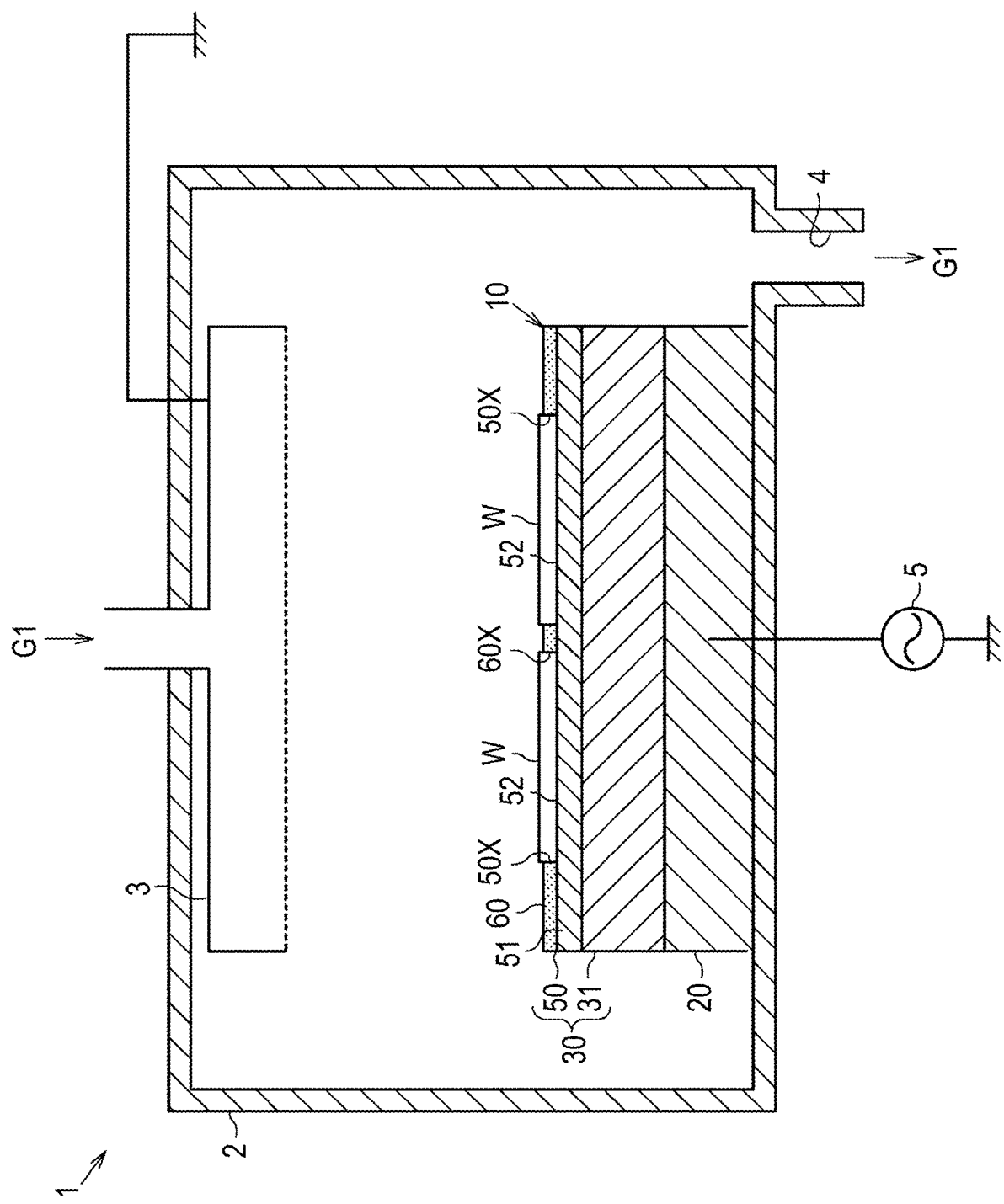
FIG. 1 is a schematic configuration diagram illustrating a semiconductor manufacturing device according to an embodiment.

Hereinafter, an embodiment will be described with reference to the accompanying drawings.

In the accompanying drawings, for the sake of convenience, a characteristic portion may be enlarged to facilitate understanding of the characteristic, and a dimensional ratio of each constituent element may be different among the drawings. In addition, in the cross-sectional view, in order to facilitate understanding of the cross-sectional structure of each member, hatching of some members is illustrated in place of a satin pattern, and hatching of some members is omitted. In this specification, a "plan view" refers to viewing an object from a vertical direction (an upper-lower direction in the drawing) in FIG. 1 and the like, and a "planar shape" refers to a shape of the object viewed from the vertical direction in FIG. 1 and the like. The "upper-lower direction"

and a "left-right direction" in the present specification are directions when a direction in which a reference numeral indicating each member in each drawing can be correctly read is defined as a normal position.

Overall Configuration of Semiconductor Manufacturing Device 1

As illustrated in FIG. 1, a semiconductor manufacturing device 1 includes a chamber 2 and a substrate fixing device 10 accommodated in the chamber 2. The substrate fixing device 10 fixes substrates W. The semiconductor manufacturing device 1 is, for example, a plasma etching device.

An upper electrode 3 facing the substrate fixing device 10 is provided at an upper portion of the chamber 2. The upper electrode 3 also functions as, for example, a shower head for supplying an etching gas G1 into the chamber 2. Here, "facing" in the present specification means that surfaces or members are positioned in front of each other, and includes not only a case where surfaces or members are completely positioned in front of each other but also a case where surfaces or members are partially positioned in front of each other. In addition, "facing" in this specification includes both a case where a member different from the two portions is interposed between the two portions and a case where nothing is interposed between the two portions.

A discharge port 4 is provided in a lower portion of the chamber 2. The etching gas G1 is discharged from the discharge port 4 to the outside of the chamber 2.

Configuration of Substrate W

Figure 2:
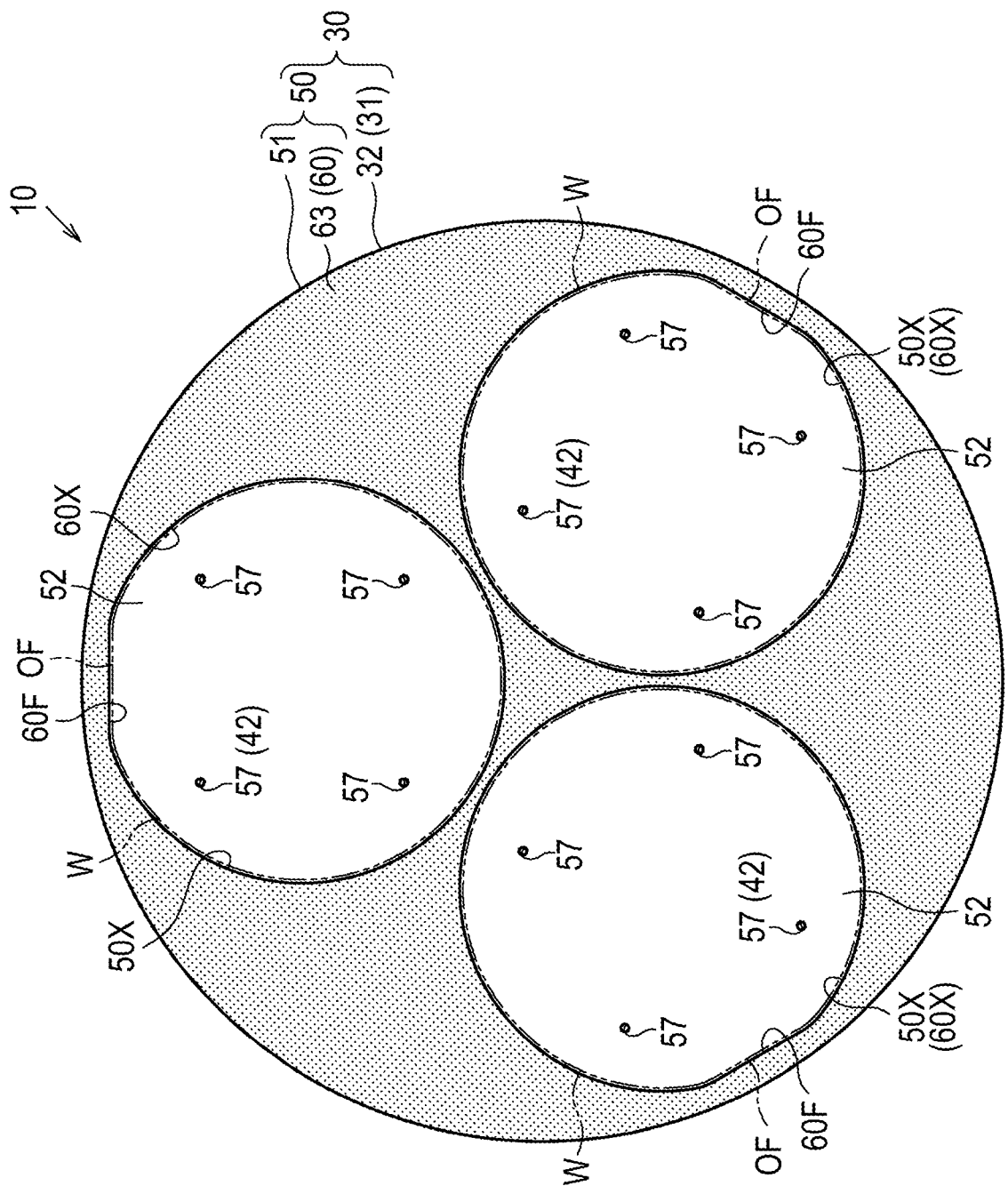
FIG. 2 is a schematic plan view illustrating the substrate fixing device according to the embodiment.

As illustrated in FIG. 2, a plurality of (here, three) substrates W are fixed to the substrate fixing device 10. Each substrate W is an object to be fixed to the substrate fixing device 10. Each substrate W is, for example, a silicon wafer. A planar shape of each substrate W can be any shape and any size. The planar shape of each substrate W is, for example, a circular shape as a whole. Each substrate W has, for example, an orientation flat OF. A diameter of the substrate W may be, for example, about 100 mm to 150 mm.

Overall Configuration of Substrate Fixing Device 10

As illustrated in FIG. 1, the substrate fixing device 10 includes a conductive base plate 20 and a substrate fixture 30 mounted on the base plate 20. The base plate 20 is a base member for mounting the substrate fixture 30.

The substrate fixture 30 includes an electrostatic chuck 31 and a tray 50 mounted on an upper surface of the electrostatic chuck 31. The tray 50 has, for example, a plurality of accommodation recesses 50X that respectively accommodate a plurality of substrates W. The electrostatic chuck 31 sucks and holds the tray 50 that accommodates the plurality of substrates W. In addition, the electrostatic chuck 31 is, for example, a temperature adjusting device that adjusts a temperature of the substrate W accommodated in the tray 50.

Configuration of Base Plate 20

The base plate 20 is formed in a circular plate shape, for example. A planar shape of the base plate 20 may be, for example, circular. A diameter of the base plate 20 may be, for example, about 200 mm to 450 mm. A thickness of the base plate 20 may be, for example, about 20 mm to 50 mm. As a material of the base plate 20, for example, a metal material such as aluminum or a super hard alloy, a composite material of the metal material and a ceramic material, or the like can be used.

The base plate 20 is connected to, for example, a high-frequency power supply 5. The base plate 20 functions as, for example, a lower electrode for controlling plasma. For example, a predetermined high-frequency power is supplied from the high-frequency power supply 5 to the base plate 20.

In the semiconductor manufacturing device 1, the etching gas G1 is turned into plasma by applying the high-frequency power to the base plate 20 in a state in which the inside of the chamber 2 is depressurized while maintaining the upper electrode 3 at a ground potential, and accordingly the substrate W is plasma-etched.

Figure 3:
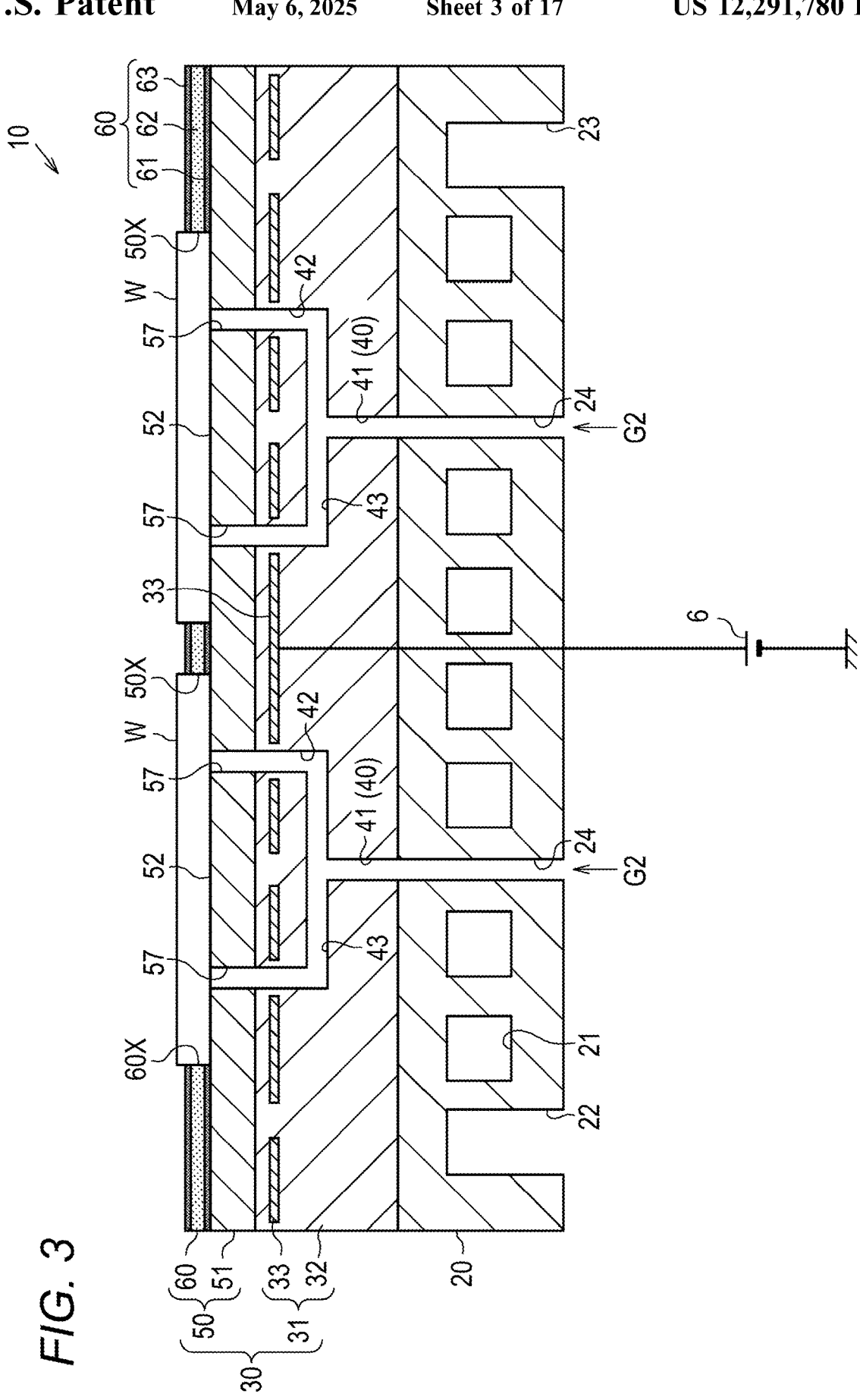
FIG. 3 is a schematic cross-sectional view illustrating a substrate fixing device according to the embodiment.

As illustrated in FIG. 3, for example, a cooling path 21 is provided inside the base plate 20. The cooling path 21 includes an introduction portion 22 provided at one end thereof and a discharge portion 23 provided at the other end thereof. The cooling path 21 is connected to, for example, a cooling medium control device (not illustrated) provided outside the substrate fixing device 10. The cooling medium control device introduces a cooling medium from the introduction portion 22 into the cooling path 21 and discharges the cooling medium from the discharge portion 23. By circulating the cooling medium through the cooling path 21 to cool the base plate 20, the tray 50 and the substrate W sucked on the electrostatic chuck 31 can be cooled. As the cooling medium, for example, water or Galden can be used.

For example, gas paths 24 for introducing an inert gas G2 for cooling are provided inside the base plate 20. The base plate 20 has a plurality of gas paths 24 respectively corresponding to the plurality of accommodation recesses 50X of the tray 50. The base plate according to the present embodiment has three gas paths 24. The inert gas G2 is a gas for cooling each substrate W accommodated in the accommodation recess 50X of the tray 50. As the inert gas G2, for example, helium gas can be used.

Configuration of Electrostatic Chuck 31

The electrostatic chuck 31 has, for example, a circular plate shape. A planar shape of the electrostatic chuck 31 may be, for example, a circular. A diameter of the electrostatic chuck 31 may be, for example, equal to or smaller than the diameter of the base plate 20. The diameter of the electrostatic chuck 31 according to the present embodiment is equal to the diameter of the base plate 20. The diameter of the electrostatic chuck 31 may be, for example, about 200 mm to 450 mm. A thickness of the electrostatic chuck 31 may be, for example, about 3 mm to 5 mm. In the present specification, "equal" includes not only a case of being accurately equal but also a case where there is a slight difference between comparison targets due to an influence in a dimensional tolerance or the like.

The electrostatic chuck 31 includes a base body 32 and an electrostatic electrode 33 built in the base body 32. The electrostatic chuck 31 sucks the tray 50 and the substrate W by an electrostatic force. The electrostatic chuck 31 is, for example, a Johnsen-Rahbeck type electrostatic chuck. The electrostatic chuck 31 may be a Coulomb force type electrostatic chuck.

The base body 32 is bonded to an upper surface of the base plate 20 by an adhesive (not illustrated). Accordingly, the electrostatic chuck 31 is fixed to the upper surface of the base plate 20. As the adhesive, for example, a silicone-based adhesive can be used.

As a material of the base body 32, for example, a material having an insulating property can be used. For example, ceramics such as alumina, aluminum nitride, and silicon nitride, and organic materials such as silicone resin and polyimide resin can be used as the material of the base body 32. In the present embodiment, ceramics such as alumina or aluminum nitride is adopted as the material of the base body 32 in terms of availability, ease of processing, and relatively high resistance to plasma or the like.

The electrostatic electrode 33 is an electrode formed in a thin film shape. The electrostatic electrode 33 is an electrode for sucking the tray 50 and the substrate W. The electrostatic electrode 33 is built in the base body 32. The electrostatic electrode 33 is built in, for example, a portion positioned in the vicinity of the upper surface of the base body 32 in a thickness direction of the base body 32. The electrostatic electrode 33 is disposed, for example, on a plane parallel to the upper surface of the base body 32. The electrostatic electrode 33 is electrically connected to a power supply 6 for sucking provided outside the substrate fixing device 10. When a predetermined voltage is applied from the power supply 6 for sucking, the electrostatic electrode 33 generates a suction force by electrostatic electricity between the tray 50 mounted on the upper surface of the base body 32 and the electrostatic electrode 33. Accordingly, the tray 50 accommodating the plurality of substrates W can be sucked and held on the upper surface of the base body 32. A suction and holding force of the electrostatic chuck 31 increases as the voltage applied to the electrostatic electrode 33 increases. The electrostatic electrode 33 may have a unipolar shape or a bipolar shape. As the material of the electrostatic electrode 33, for example, tungsten (W) or molybdenum (Mo) can be used.

For example, gas holes 40 communicating with the gas paths 24 of the base plate 20 are provided inside the base body 32. The base body 32 has a plurality of gas holes 40 respectively corresponding to the plurality of accommodation recesses 50X. The base body 32 according to the present embodiment has three gas holes 40. Each gas hole 40 is formed so as to penetrate the base body 32 in the thickness direction. Each gas hole 40 is provided so as to overlap the accommodation recess 50X in a plan view. An opening end of each gas hole 40 is provided so as to be exposed on the upper surface of the base body 32. For example, the inert gas G2 is introduced into each gas hole 40 from the corresponding gas path 24.

Each gas hole 40 includes, for example, a first hole portion 41 extending from a lower surface toward the upper surface of the base body 32, second hole portions 42 extending from the upper surface toward the lower surface of the base body 32, and a third hole portion 43 communicating the first hole portion 41 with the second hole portions 42.

The first hole portion 41 is formed so as to open downward of the base body 32. The first hole portion 41 is formed to linearly extend along the thickness direction of the base body 32, for example. A lower end portion of the first hole portion 41 communicates with the gas path 24. An upper end portion of the first hole portion 41 communicates with the third hole portion 43. A shape and a size of the first hole portion 41 can be any shape and any size.

The second hole portion 42 is formed so as to open above the base body 32. The second hole portion 42 is formed to linearly extend along the thickness direction of the base body 32, for example. A lower end portion of the second hole portion 42 communicates with the third hole portion 43. A shape and a size of the second hole portion 42 can be any shape and any size.

The plurality of second hole portions 42 are provided apart from each other in a plan view. In this example, for example, four second hole portions 42 are provided for each of the three accommodation recesses 50X.

The third hole portion 43 is provided between the first hole portion 41 and the second hole portion 42 in the thickness direction of the base body 32. The third hole portion 43 is formed so as to extend in a planar direction (left-right direction in the drawing) of the base body 32. The third hole portion 43 is formed, for example, so as to communicate one first hole portion 41 with a plurality of (here, four) second hole portions 42. A shape and a size of the third hole portion 43 can be any shape and any size.

Configuration of Tray 50

The tray 50 is mounted on the upper surface of the base body 32. The tray 50 is formed to cover the upper surface of the base body 32.

The tray 50 has a bottom plate portion 51, a coating film layer 60 formed on an upper surface of the bottom plate portion 51, and opening portions 60X penetrating the coating film layer 60 in the thickness direction. The coating film layer 60 is made of a material different from that of the bottom plate portion 51.

The bottom plate portion 51 is formed in a plate shape, for example. The bottom plate portion 51 is formed in a circular plate shape, for example. A planar shape of the bottom plate portion 51 may be, for example, circular. A diameter of the bottom plate portion 51 may be equal to or smaller than the diameter of the electrostatic chuck 31, for example. The diameter of the bottom plate portion 51 according to the present embodiment is equal to the diameter of the electrostatic chuck 31. The diameter of the bottom plate portion 51 may be, for example, about 200 mm to 450 mm. A thickness of the bottom plate portion 51 may be, for example, about 3 mm to 5 mm.

As a material of the bottom plate portion 51, for example, an insulating material can be used. For example, ceramics such as alumina, aluminum nitride, and silicon nitride can be used as the material of the bottom plate portion 51. The bottom plate portion 51 of this example is a ceramic substrate. The bottom plate portion 51 has, for example, a lower volume resistivity than the base body 32. For example, the bottom plate portion 51 is formed of only alumina to which titanium is added as an impurity, and the volume resistivity of the bottom plate portion 51 is set to be equal to or lower than the volume resistivity of the base body 32 by increasing a concentration of titanium.

The bottom plate portion 51 has an upper surface and a lower surface opposite to the upper surface in a thickness direction of the bottom plate portion 51. A lower surface of the bottom plate portion 51 is in contact with the upper surface of the base body 32. The upper surface of the bottom plate portion 51 has a plurality of substrate placement portions 52 on which each of the plurality of substrates W is placed. The upper surface of the bottom plate portion 51 according to the present embodiment has three substrate placement portions 52. The substrate placement portion 52 is provided in a portion of the upper surface of the bottom plate portion 51 exposed from the opening portion 60X of the coating film layer 60.

Figure 4:
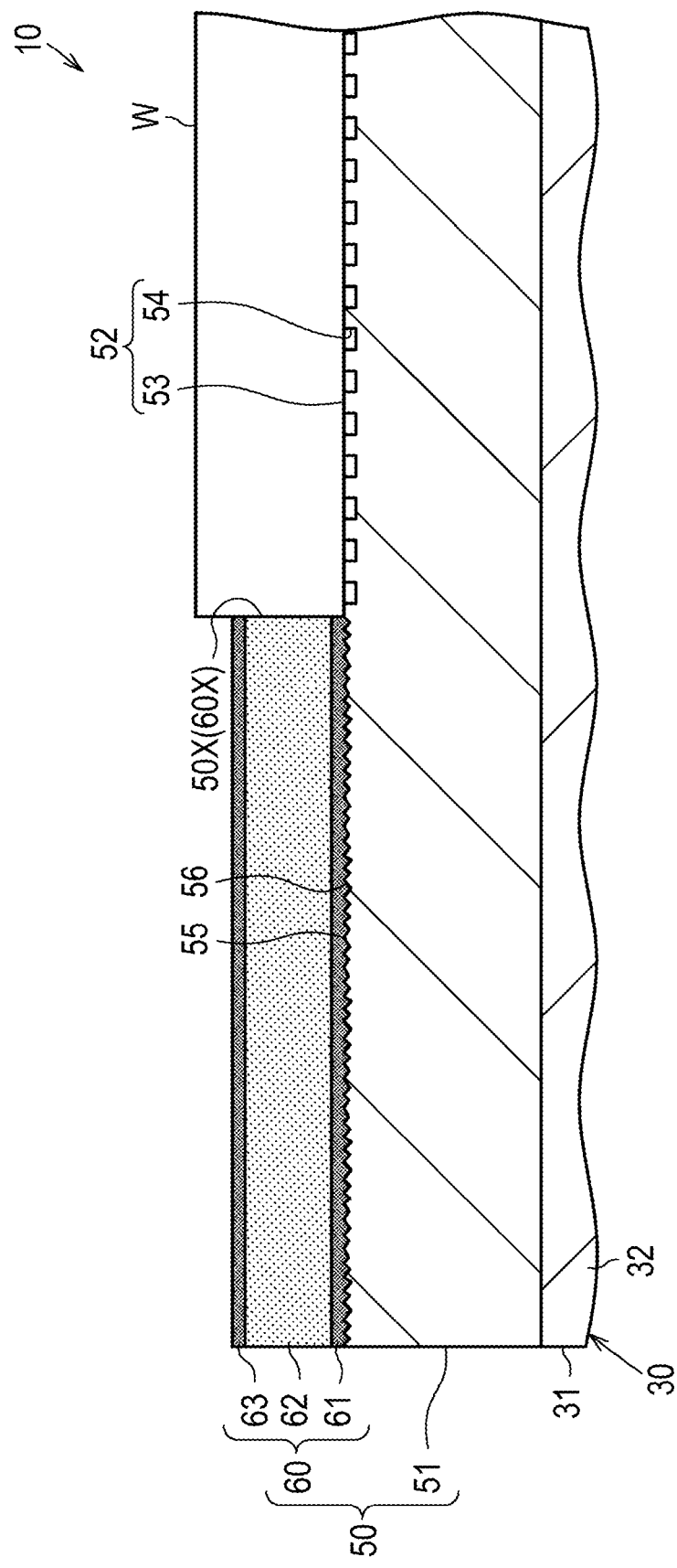
FIG. 4 is an enlarged schematic cross-sectional view illustrating a part of the substrate fixing device according to the embodiment.

As illustrated in FIG. 4, each substrate placement portion 52 is provided with a plurality of embossed portions 53. The plurality of embossed portions 53 are provided, for example, side by side along a planar direction of the bottom plate portion 51 (that is, a direction orthogonal to the thickness direction of the bottom plate portion 51 in a cross-sectional view). The plurality of embossed portions 53 are formed by, for example, providing a plurality of recesses 54 recessed from the upper surface of the bottom plate portion 51 toward the electrostatic chuck 31. Each of the recesses 54 is formed, for example, so as to extend from the upper surface of the bottom plate portion 51 to the middle of the bottom plate portion 51 in the thickness direction. The plurality of embossed portions 53 and the plurality of recesses 54 are provided, for example, so as to spread over the entire substrate placement portion 52.

The upper surface of the bottom plate portion 51 has, for example, a roughened surface 55. The roughened surface 55 is provided on a portion of the upper surface of the bottom plate portion 51 that overlaps the coating film layer 60 in a plan view. In other words, the roughened surface 55 is provided on a portion of the upper surface of the bottom plate portion 51 other than the substrate placement portions 52. The roughened surface 55 is provided, for example, so as to partition areas of the three substrate placement portions 52. The roughened surface 55 is formed so as to surround each of the three substrate placement portions 52 in a plan view, for example. The roughened surface 55 is formed to have a surface roughness larger than that of the lower surface of the bottom plate portion 51, for example. In the roughened surface 55, for example, a recess 56 constituting the roughened surface 55 is shallower than the recess 54 of the substrate placement portion 52. The roughened surface 55 can have a surface roughness Ra of 800 nm or more, for example. Here, the surface roughness Ra value is a kind of numerical value representing the surface roughness and is referred to as an arithmetic average roughness, and specifically is a value obtained by measuring an absolute value of a height changing in a measurement area from a surface which is an average line and performing arithmetic averaging.

As illustrated in FIG. 3, for example, a gas hole 57 communicating with the gas hole of the electrostatic chuck 31 is provided inside the bottom plate portion 51. The bottom plate portion 51 is provided with a plurality of gas holes 57 communicating with the plurality of second hole portions 42 of the gas hole 40. Each gas hole 57 is formed so as to penetrate through the bottom plate portion 51 in the thickness direction. Each gas hole 57 is formed so as to penetrate from the lower surface to the upper surface of the bottom plate portion 51. Each gas hole 57 is provided so as to overlap the substrate placement portion 52 in a plan view. That is, each gas hole 57 is provided so as to overlap the substrate W placed on the substrate placement portion 52 in a plan view. An opening end of each gas hole 57 is provided so as to be exposed to the substrate placement portion 52. For example, the inert gas G2 is introduced into each gas hole 57 from the corresponding gas hole 40.

The gas hole 57 is formed to linearly extend along the thickness direction of the bottom plate portion 51, for example. The gas hole 57 is formed, for example, so as to open below the bottom plate portion 51 and open above the bottom plate portion 51. A lower end portion of the gas hole 57 communicates with the second hole portion 42 of the gas hole 40. The upper end portion of the gas hole 57 is a discharge port of the gas hole 57 for discharging the inert gas G2 to the outside of the gas hole 57. A shape and a size of the gas hole 57 can be any shape and any size.

As illustrated in FIG. 2, the plurality of gas holes 57 are provided apart from each other in a plan view. For example, four gas holes 57 are provided for each of the three substrate placement portions 52. The four gas holes 57 are dispersedly provided on each substrate placement portion 52. For example, the four gas holes 57 are dispersedly provided in four directions of each substrate placement portion 52 in a plan view. For example, the four gas holes 57 are provided on the same circumference in a plan view.

As illustrated in FIG. 3, in the gas holes 40 and 57, the inert gas G2 is introduced into the first hole portion 41 of the gas hole 40 through the gas path 24, and the inert gas G2 flows into the third hole portion 43 through the first hole portion 41. In addition, in the gas holes 40 and 57, the inert gas G2 flowing into the third hole portion 43 is moved in the third hole portion 43 in the planar direction and then flows into the second hole portion 42, and the inert gas G2 flows into the gas hole 57 through the second hole portions 42. Then, the inert gas G2 is discharged from the upper end portions of the gas holes 57. The inert gas G2 discharged from the gas holes 57 can cool the substrate W by, for example, being filled between a lower surface of the substrate W placed on the substrate placement portion 52 and the substrate placement portion 52. Here, the embossed portions 53 and the recesses 54 (see FIG. 4) provided in the substrate placement portion 52 act to make the flow of the inert gas G2 uniform. Therefore, an amount of the inert gas G2 hitting the lower surface of the substrate W can be made uniform.

The coating film layer 60 has a function of fixing the plurality of substrates W on the bottom plate portion 51. In addition, the coating film layer 60 has a function of protecting the bottom plate portion 51 and the base body 32 of the electrostatic chuck 31 from erosion due to plasma irradiation when plasma treatment is performed in the semiconductor manufacturing device 1 (see FIG. 1) in an environment using a process gas having high erosion resistance.

As illustrated in FIG. 4, the coating film layer 60 is formed to cover the roughened surface 55 of the upper surface of the bottom plate portion 51. The coating film layer 60 is formed in close contact with the roughened surface 55. As illustrated in FIG. 2, the coating film layer 60 is formed to cover a portion of the upper surface of the bottom plate portion 51 other than the substrate placement portion 52. In other words, the coating film layer 60 has the opening portions 60X that expose the substrate placement portions 52. The coating film layer 60 according to the present embodiment has three opening portions 60X that respectively expose the three substrate placement portions 52. Each opening portion 60X is formed to define the area of each substrate placement portion 52. The planar shape of each opening portion 60X is formed in a shape corresponding to the planar shape of the substrate W. The planar shape of each opening portion 60X is formed in a circular shape as a whole. The planar shape of each opening portion 60X has, for example, a flat portion 60F corresponding to the orientation flat OF of the substrate W. A size of the planar shape of each opening portion 60X is equal to or slightly larger than the size of the planar shape of the substrate W. The substrate W is accommodated in the opening portion 60X such that, for example, the orientation flat OF is aligned with the flat portion 60F of the opening portion 60X. Accordingly, the substrate W can be accommodated in the opening portion 60X in a state in which the orientation flat OF of the substrate W faces a desired direction.

As illustrated in FIG. 3, in the tray 50, an inner side surface of the opening portion 60X of the coating film layer 60 and the upper surface of the bottom plate portion 51 exposed from the opening portion 60X, that is, the upper surface of the bottom plate portion 51 constituting the substrate placement portion 52 constitute the accommodation recess 50X for accommodating the substrate W.

As illustrated in FIG. 4, the coating film layer 60 is formed in a multilayer structure including a coating film 61 formed on the upper surface of the bottom plate portion 51, a coating film 62 laminated on an upper surface of the coating film 61, and a coating film 63 laminated on an upper surface of the coating film 62. As materials of the coating films 61, 62, and 63, a material having higher durability against plasma, that is, plasma resistance than the material (for example, alumina) constituting the bottom plate portion 51 can be used. As the materials of the coating films 61, 62, and 63, for example, a ceramic material having excellent plasma resistance can be used. For example, as the materials of the coating films 61, 62, and 63, a dilute earth oxide such as yttrium aluminum garnet (YAG) or yttria ($Y_2O_3$) or fluoride can be suitably used. The materials of the coating films 61, 62, and 63 may be different from each other or may be the same type of material.

The coating film 61 is formed in close contact with the roughened surface 55, for example. The coating film 61 is formed to cover the roughened surface 55. The coating film 61 is formed, for example, so as to cover the entire roughened surface 55. The coating film 61 is formed, for example, so as to fill unevenness of the roughened surface 55. The coating film 61 is formed, for example, so as to fill the recesses 56 of the roughened surface 55. The coating film 61 has higher plasma resistance than the bottom plate portion 51, for example. For example, the coating film 61 has higher plasma resistance than the coating film 62. For example, the coating film 61 has a higher density than the coating film 62. In other words, the coating film 61 is formed denser than the coating film 62. Here, the density refers to volumetric density (e.g., gram per cubic centimeter). The coating film 61 is thinner than the coating film 62, for example. A thickness of the coating film 61 may be, for example, about 3 μm to 15 μm. The coating film 61 is, for example, a PVD film formed by physical vapor deposition (PVD). The coating film 61 according to the present embodiment is an yttria film formed by a PVD method.

The coating film 62 is formed in close contact with the upper surface of the coating film 61. The coating film 62 is formed to cover the entire upper surface of the coating film 61. The coating film 62 has higher plasma resistance than the bottom plate portion 51. For example, the coating film 62 has lower plasma resistance than the coating film 63. For example, the coating film 62 has a lower density than the coating film 63. Here, the density refers to volumetric density (e.g., gram per cubic centimeter). The coating film 62 is thicker than the coating film 63, for example. A thickness of the coating film 62 may be, for example, about 200 μm to 1000 μm. The coating film 62 is, for example, a thermal spray film formed by a thermal spraying method. The coating film 62 according to the present embodiment is an yttria thermally sprayed film formed by the thermal spraying method.

The coating film 63 is formed in close contact with the upper surface of the coating film 62. The coating film 63 is formed to cover the entire upper surface of the coating film 62. The coating film 63 has higher plasma resistance than the bottom plate portion 51. The coating film 63 has, for example, plasma resistance similar to that of the coating film 61. For example, the coating film 63 has a density higher than that of the coating film 62, and has a density similar to that of the coating film 61. Here, the density refers to volumetric density (e.g., gram per cubic centimeter). The coating film 63 is denser than the coating film 62. For example, the coating film 63 is thinner than the coating film 62, and has the same thickness as the coating film 61. A thickness of the coating film 63 may be, for example, about 3 μm to 15 μm.

The total thickness of the coating film layer 60, that is, the total thickness of the coating films 61, 62, and 63 is smaller than the thickness of the substrate W, for example. The total thickness of the coating film layer 60 is, for example, 0.5 times or more and less than 1 time the thickness of the substrate W.

The opening portion 60X is formed to penetrate the coating film 61, the coating film 62, and the coating film 63 in the thickness direction. The inner side surface of the opening portion 60X is formed, for example, to linearly extend along the thickness direction of the coating film layer 60, for example. That is, a bottom portion of the opening portion 60X is not formed in an R shape. A side surface of the coating film 61 constituting the inner side surface of the opening portion 60X, a side surface of the coating film 62 constituting the inner side surface of the opening portion 60X, and a side surface of the coating film 63 constituting the inner side surface of the opening portion 60X are formed, for example, flush with each other. The inner side surface of the opening portion 60X is in contact with, for example, the side surface of the substrate W accommodated in the opening portion 60X.

Method for Manufacturing Substrate Fixing Device 10

Next, a method for manufacturing the substrate fixing device 10 will be described. Here, a method for manufacturing the tray 50 will be described in detail.

Figure 5:
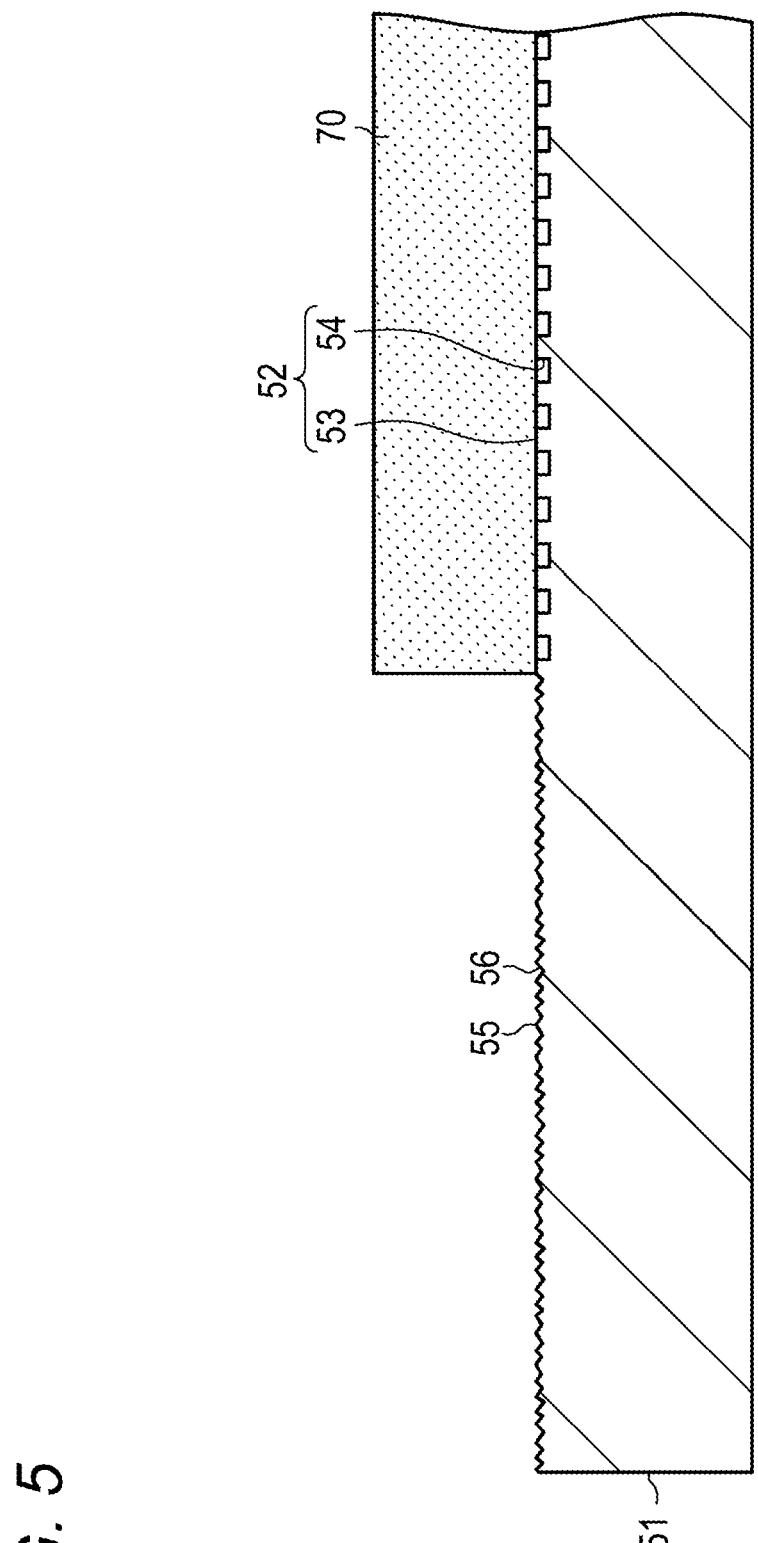
FIG. 5 is a schematic cross-sectional view illustrating a method for manufacturing a tray according to the embodiment.

In a step illustrated in FIG. 5, first, the bottom plate portion 51 which is a ceramic substrate is prepared. Subsequently, the recesses 54 are formed in a portion of the upper surface of the bottom plate portion 51 which becomes the substrate placement portion 52, and the embossed portions 53 are formed in the substrate placement portion 52. A method for forming the recesses 54 is not particularly limited. The recesses 54 can be formed by, for example, blasting the upper surface of the bottom plate portion 51 while masking the upper surface of the bottom plate portion 51 other than the substrate placement portion 52.

Next, a mask member 70 is formed to cover the substrate placement portion 52 on the upper surface of the bottom plate portion 51. In other words, the mask member 70 is formed to expose only an area of the upper surface of the bottom plate portion 51 where the coating film layer 60 (see FIG. 3) is to be formed. Thereafter, only a portion of the upper surface of the bottom plate portion 51 exposed from the mask member 70 is roughened. Thus, the upper surface of the bottom plate portion 51 exposed from the mask member 70 is formed as the roughened surface 55. The roughening treatment can be performed by, for example, etching, blasting, or the like. Although not illustrated, a mask member may be formed to cover a side surface and a lower surface of the bottom plate portion 51.

Figure 6:
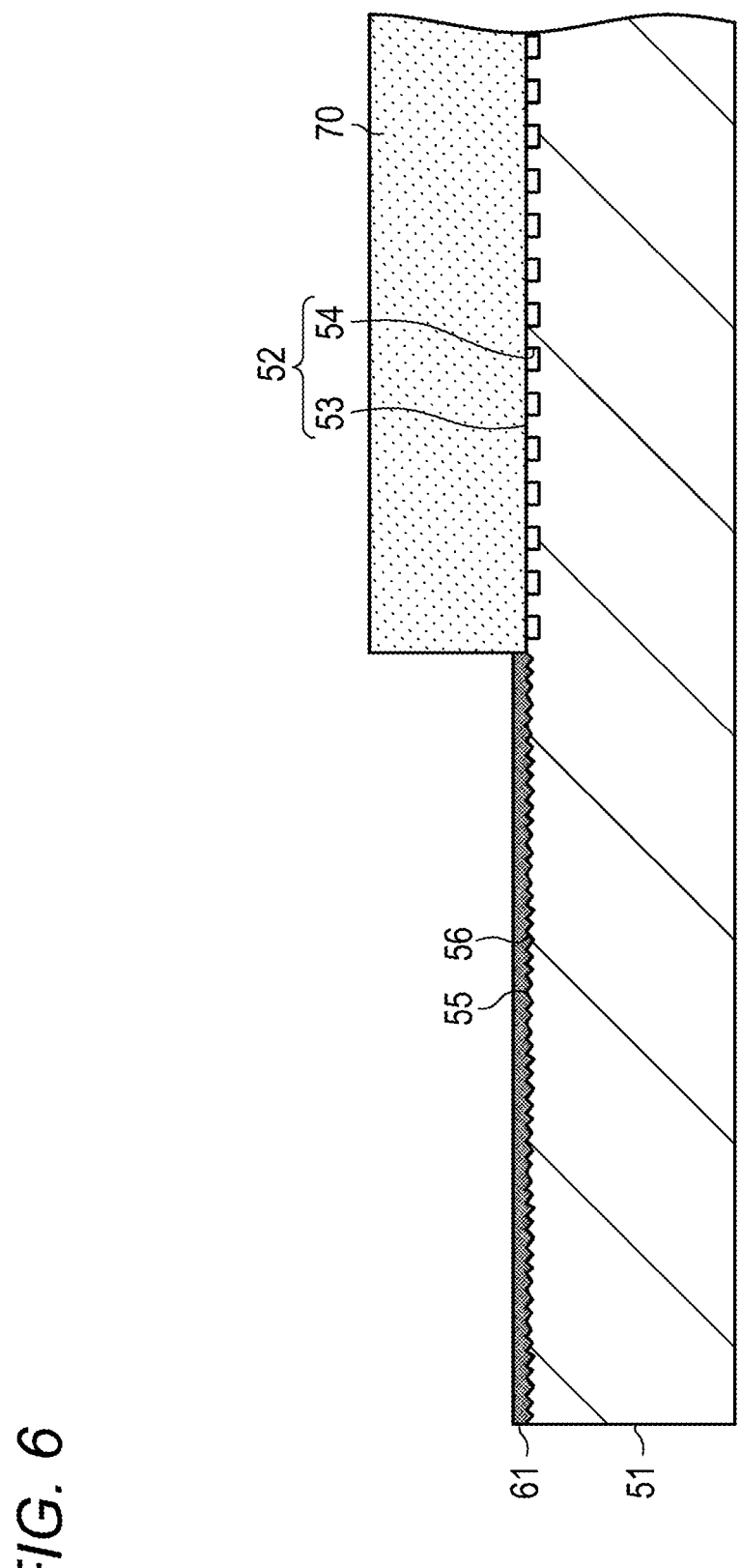
FIG. 6 is a schematic cross-sectional view illustrating the method for manufacturing a tray according to the embodiment.

Next, in a step illustrated in FIG. 6, the coating film 61 is formed on a portion of the upper surface of the bottom plate portion 51 exposed from the mask member 70. That is, the coating film 61 is formed on the roughened surface 55. The coating film 61 is formed in close contact with the roughened surface 55. A side surface of the coating film 61 is formed in contact with side surfaces of the mask members 70. The coating film 61 can be formed by, for example, a PVD method or a high-speed solid particle deposition method. By forming the coating film 61 by the PVD method or the high-speed solid particle deposition method described above, the coating film 61 can be formed more densely.

Figure 7:
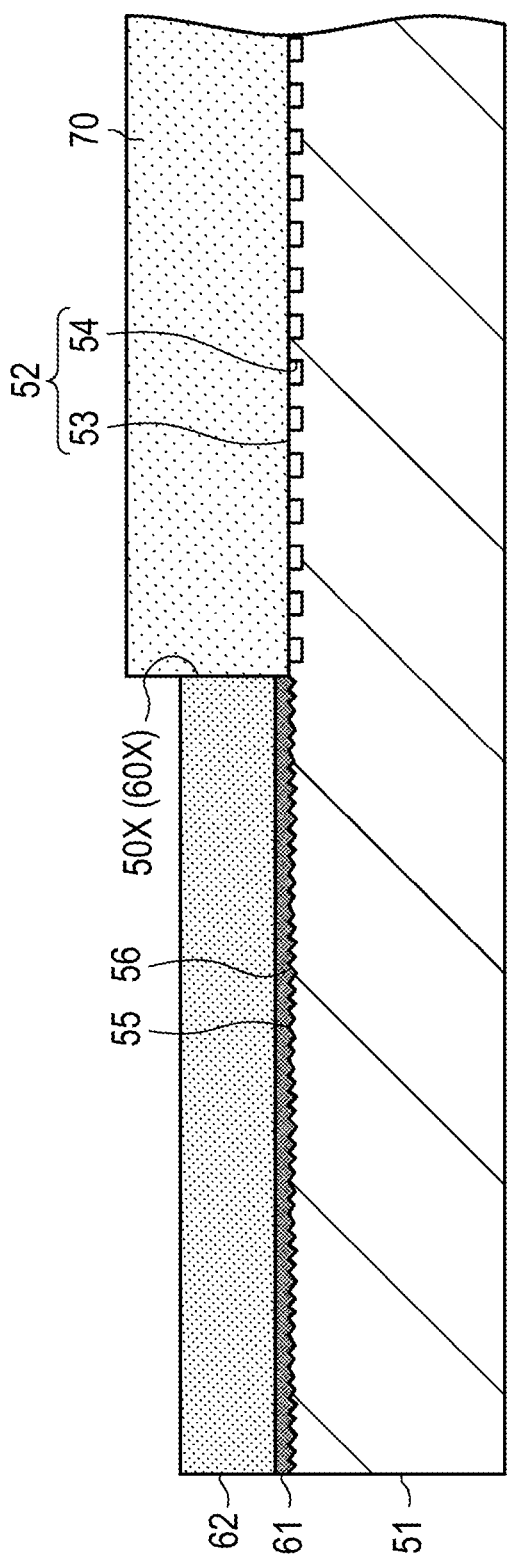
FIG. 7 is a schematic cross-sectional view illustrating the method for manufacturing a tray according to the embodiment.

Subsequently, in a step illustrated in FIG. 7, the coating film 62 is formed on the upper surface of the coating film 61. The coating film 62 is thicker than the coating film 61. The coating film 62 can be formed by, for example, the thermal spraying method. The coating film 62 can be formed by, for example, spraying yttria on the upper surface of the coating film 61. By forming the coating film 62 by such a thermal spraying method, the coating film 62 can be easily formed thick. This step is performed in a state in which the substrate placement portions 52 of the upper surface of the bottom plate portion 51 are covered with the mask members 70. At this time, the side surface of the coating film 62 is formed in contact with the side surfaces of the mask members 70.

Figure 8:
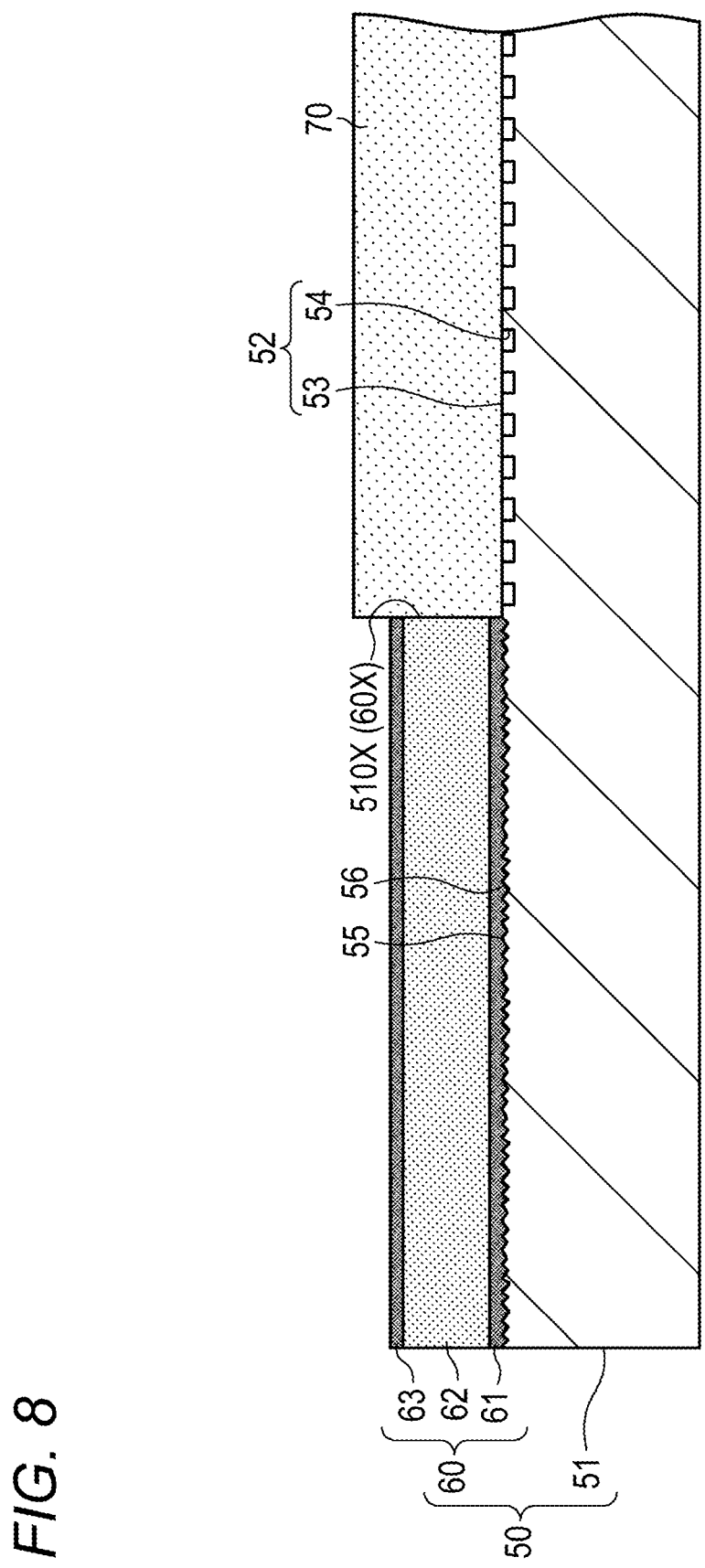
FIG. 8 is a schematic cross-sectional view illustrating the method for manufacturing a tray according to the embodiment.

Next, in a step illustrated in FIG. 8, the coating film 63 is formed on the upper surface of the coating film 62. The coating film 63 can be formed by, for example, the PVD method or the high-speed solid particle deposition method. By forming the coating film 63 by the PVD method or the high-speed solid particle deposition method described above, the coating film 61 can be formed more densely than the coating film 62 which is the thermal spray film. This step is performed in a state in which the substrate placement portions 52 of the upper surface of the bottom plate portion 51 are covered with the mask members 70. At this time, the side surface of the coating film 63 is formed to be in contact with the side surfaces of the mask members 70.

By the above manufacturing steps, the coating film layer 60 including the coating films 61, 62, and 63 is formed on the upper surface of the bottom plate portion 51. Thereafter, the mask members 70 are removed. Thus, the opening portions 60X of the coating film layer 60 are formed in the portions where the mask members 70 have been formed. Here, the side surfaces of the portions that are in contact with the side surfaces of the mask members 70, that is, the side surfaces of the coating films 61, 62, and 63 that constitute the inner side surfaces of the opening portions 60X, are formed in a shape along the side surfaces of the mask members 70. That is, the side surfaces of the coating films 61, 62, and 63 constituting the inner side surfaces of the opening portions 60X are formed to linearly extend along the thickness direction of the coating film layer 60, for example.

The tray 50 according to the present embodiment can be manufactured by the above manufacturing steps.

Next, effects according to the present embodiment will be described.

(1) The tray 50 includes the bottom plate portion 51 placed on the electrostatic chuck 31, the coating film layer 60 made of a material different from that of the bottom plate portion 51 and formed on the upper surface of the bottom plate portion 51, and the opening portions 60X penetrating the coating film layer 60 in the thickness direction.

According to this configuration, the opening portion 60X of the coating film layer 60 and the upper surface of the bottom plate portion 51 exposed to the opening portion 60X constitute the accommodation recess 50X for accommodating the substrate W. Accordingly, the opening portion 60X of the coating film layer 60 can be formed to penetrate the coating film layer 60 in the thickness direction. Therefore, compared to the recess 103X of the tray 103 of the related art, it is possible to suitably prevent the formation of the R shape on the inner side surface of the opening portion 60X. As a result, it is possible to suitably prevent inclination of the substrate W in the accommodation recess 50X. In addition, since it is possible to prevent the formation of the R shape on the inner side surface of the opening portion 60X, it is not necessary to form an opening diameter of the opening portion 60X (accommodation recess 50X) to be larger by the R shape. Therefore, it is possible to suitably prevent movement of the substrate W in the accommodation recess 50X. Accordingly, the substrate W can be suitably fixed in a state of being accommodated in the accommodation recess 50X.

(2) The coating film layer 60 has the multilayer structure including the coating film 62 having higher plasma resistance than the bottom plate portion 51 and the coating film 63 laminated on the upper surface of the coating film 62 and having higher plasma resistance than the coating film 62. The coating film 62 is thicker than the coating film 63.

According to this configuration, it is possible to improve the plasma resistance of the coating film layer 60 by the coating film 63 formed on the upper surface of the coating film 62 while ensuring the total thickness of the coating film layer 60 by the coating film 62. More specifically, the coating film 63 having higher plasma resistance than the bottom plate portion 51 and the coating film 62 is less likely to be eroded in a plasma atmosphere than the bottom plate portion 51 and the coating film 62. Therefore, erosion of the coating film 62 and the bottom plate portion 51 in the plasma atmosphere can be suitably prevented by the coating film 63. As a result, the life of the tray 50 and the substrate fixture 30 can be extended.

(3) When the coating film 63 is etched and thinned due to long-term use, only the coating film 63 may be formed again, and it is not necessary to replace the entire substrate fixture 30. Therefore, the operation cost of the substrate fixture 30 can be reduced as compared with the tray 103 of the related art.

(4) The coating film 63 has a higher density than the coating film 62. Here, the density refers to volumetric density (e.g., gram per cubic centimeter). Accordingly, the plasma resistance of the coating film 63 can be more suitably improved than the plasma resistance of the coating film 62. Therefore, erosion of the coating film 62 and the bottom plate portion 51 in the plasma atmosphere can be suitably prevented by the coating film 63.

(5) The coating film layer 60 has the coating film 61 formed on the upper surface of the bottom plate portion 51. The coating film 61 has higher plasma resistance than the coating film 62. The coating film 62 is laminated on the upper surface of the coating film 61. The coating film 61 is thinner than the coating film 62.

According to this configuration, the coating film 61 that directly covers the upper surface of the bottom plate portion 51 has higher plasma resistance than the coating film 62. Therefore, erosion of the bottom plate portion 51 in the plasma atmosphere can be suitably prevented by the coating film 61. As a result, the life of the bottom plate portion 51 can be extended. Consequently, the life of the tray 50 and the substrate fixture 30 can be extended.

(6) The coating film 62 is the thermal spray film, and the coating film 61 and the coating film 63 are the PVD films. According to this configuration, since the coating film 62 is formed by the thermal spraying method, the coating film 62 can be easily formed thick. In addition, since the coating film 61 and the coating film 63 are formed by the PVD method, the coating film 61 and the coating film 63 can be formed denser than the coating film 62 which is the thermal spray film. Accordingly, the plasma resistance of the coating film 61 and the coating film 63 can be more suitably improved than the plasma resistance of the coating film 62. As a result, erosion of the bottom plate portion 51 in the plasma atmosphere can be suitably prevented by the coating film 61 and the coating film 63.

(7) The upper surface of the bottom plate portion 51 has the roughened surface 55 having a surface roughness larger than that of the lower surface of the bottom plate portion 51. The coating film layer 60 is formed to cover the roughened surface 55. According to this configuration, since adhesion strength between the coating film layer 60 and the roughened surface 55 can be improved, it is possible to suitably prevent the peeling of the coating film layer 60 from the bottom plate portion 51.

Other Embodiments

The above embodiment can be modified as follows. The embodiment described above and the following modifications can be combined with each other without technical contradiction.

Figure 9:
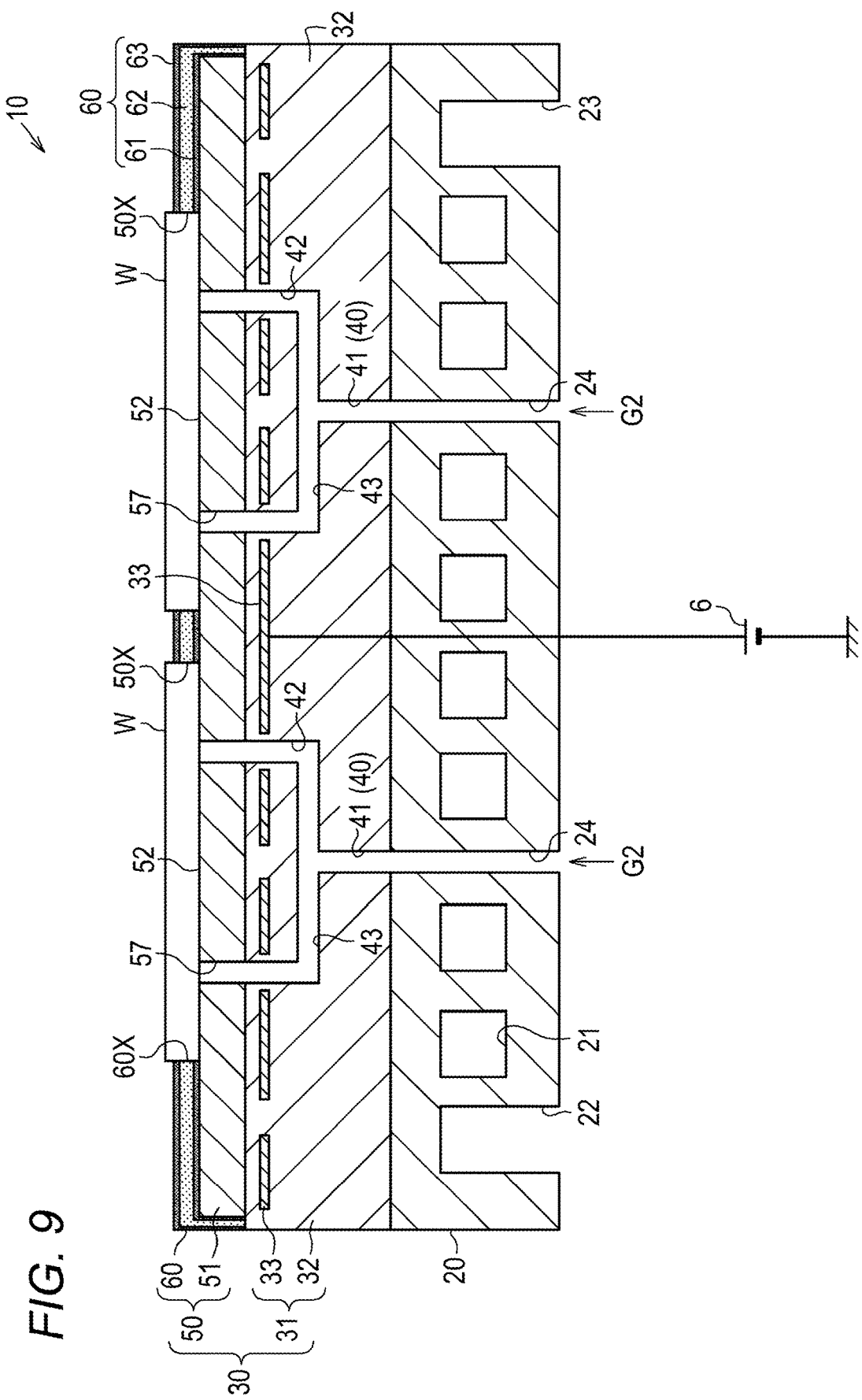
FIG. 9 is a schematic cross-sectional view illustrating a substrate fixing device according to a modification.

As illustrated in FIG. 9, the coating film layer 60 may be formed to cover the upper surface of the bottom plate portion 51 and the side surface of the bottom plate portion 51. The coating film layer 60 according to the present modification is formed to cover the entire side surface of the bottom plate portion 51, for example.

Figure 10:
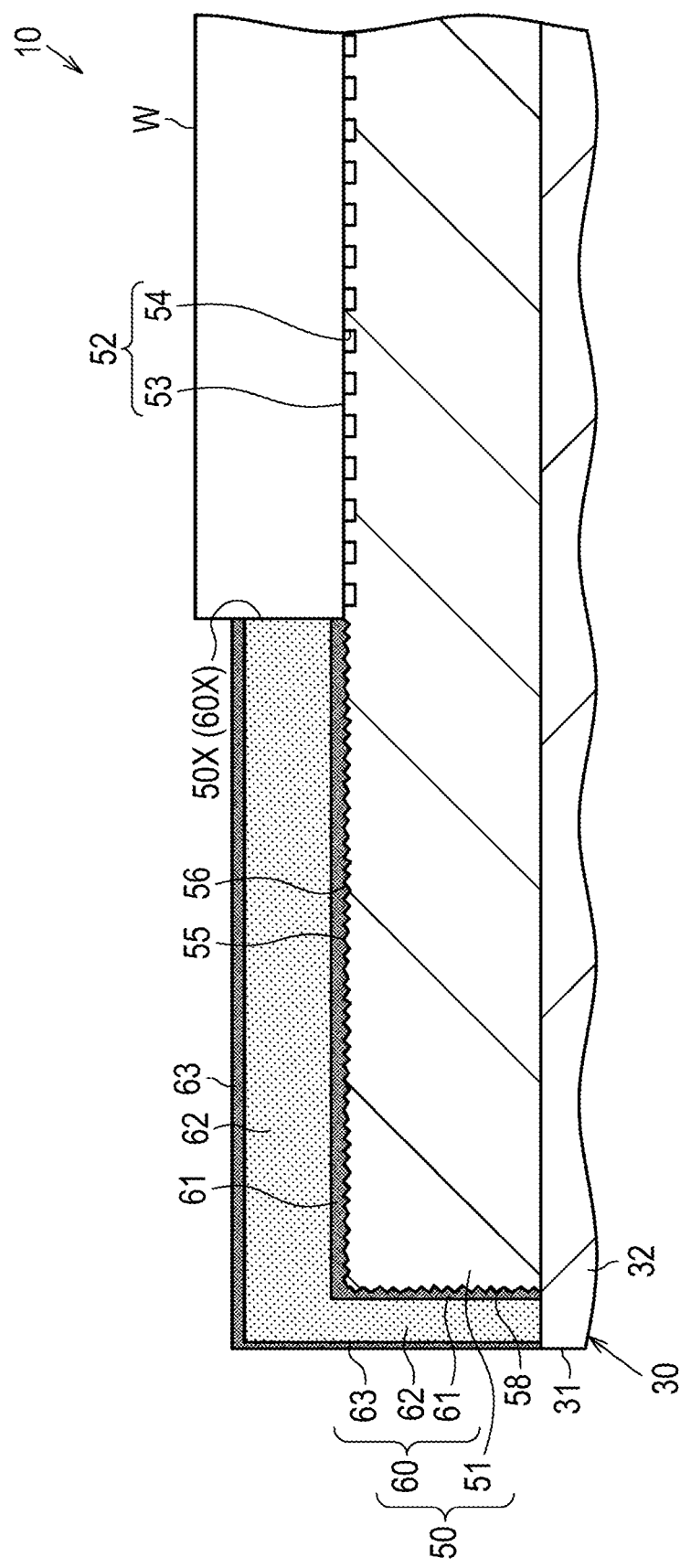
FIG. 10 is an enlarged schematic cross-sectional view illustrating a part of the substrate fixing device according to the modification.

As illustrated in FIG. 10, in the coating film layer 60 according to the present modification, a portion covering the upper surface of the bottom plate portion 51 and a portion covering the side surface of the bottom plate portion 51 are continuously and integrally formed. In the coating film layer 60 according to the present modification, the portion covering the upper surface of the bottom plate portion 51 and the portion covering the side surface of the bottom plate portion 51 have the same layer structure. That is, the portion of the coating film layer 60 covering the side surface of the bottom plate portion 51 is formed in a multilayer structure including the coating film 61 covering the side surface of the bottom plate portion 51, the coating film 62 covering the side surface of the coating film 61, and the coating film 63 covering the side surface of the coating film 62. Here, in the present modification, the entire side surface of the bottom plate portion 51 is formed as a roughened surface 58. The roughened surface 58 has a surface roughness larger than that of the lower surface of the bottom plate portion 51, for example. The roughened surface 58 may have a surface roughness Ra of 800 nm or more, for example. The coating film 61 is formed to cover the roughened surface 58. The coating film 61 is formed in close contact with the roughened surface 58. The coating film 61 is formed, for example, so as to fill unevenness of the roughened surface 58.

In the tray 50 according to the present modification, a thickness of the portion thereof covering the side surface (that is, the roughened surface 58) of the bottom plate portion 51 is smaller than a thickness of the portion thereof covering the upper surface (that is, the roughened surface 55) of the bottom plate portion 51. More specifically, a thickness of a portion of the coating film 61 covering the roughened surface 58 is smaller than the thickness of a portion of the coating film 61 covering the roughened surface 55. A thickness of a portion of the coating film 62 covering the roughened surface 58 is smaller than the thickness of a portion of the coating film 62 covering the roughened surface 55. A thickness of a portion of the coating film 63 covering the roughened surface 58 is smaller than the thickness of a portion of the coating film 63 covering the roughened surface 55. The thickness of the portion of the coating film 62 covering the roughened surface 58 is larger than the thickness of each of the portions of the coating films 61 and 62 covering the roughened surface 58.

According to this configuration, the side surface of the bottom plate portion 51 can be covered with the coating film layer 60 having higher plasma resistance than the bottom plate portion 51. Accordingly, erosion of the side surface of the bottom plate portion 51 in the plasma atmosphere can be suitably prevented by the coating film layer 60. As a result, the life of the tray 50 can be extended.

The side surface of the bottom plate portion 51 is formed as the roughened surface 58, and the coating film layer 60 is formed to cover the roughened surface 58. According to this configuration, since the adhesion strength between the coating film layer 60 and the roughened surface 58 can be improved, it is possible to suitably prevent the peeling of the coating film layer 60 from the side surface of the bottom plate portion 51.

In the coating film layer 60 according to the present modification, the thickness of the portion thereof covering the side surface of the bottom plate portion 51 is smaller than the thickness of the portion thereof covering the upper surface of the bottom plate portion 51. Accordingly, it is possible to prevent an increase in the size of the tray 50 in the planar direction due to the provision of the coating film layer 60 on the side surface of the bottom plate portion 51.

In the above embodiment, the coating film layer 60 has the multilayer structure in which the coating film 61, the coating film 62, and the coating film 63 are laminated in this order, but is not limited thereto. The layer structure can be appropriately changed as long as the coating film layer 60 may have any multilayer structure including the coating film 62 and the coating film 63.

Figure 11:
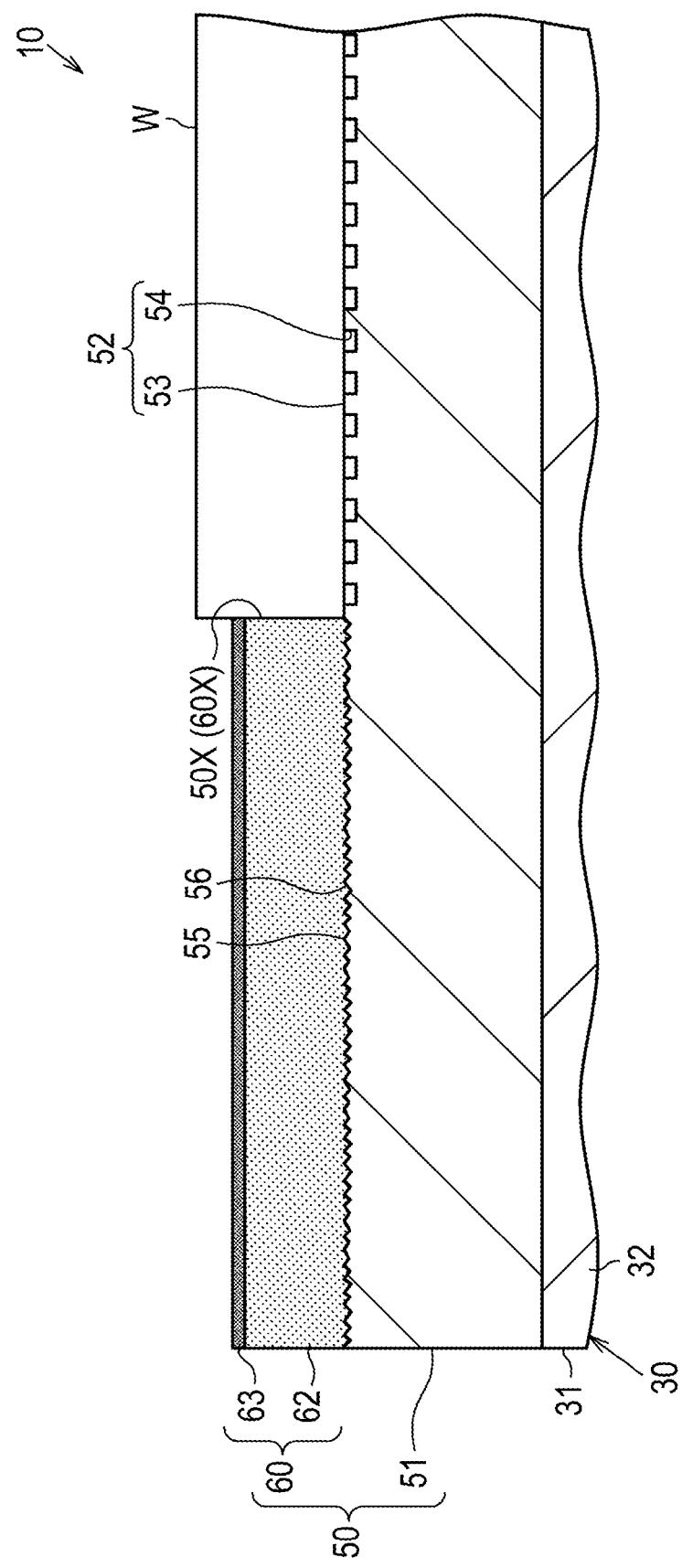
FIG. 11 is an enlarged cross-schematic sectional view illustrating a part of the substrate fixing device according to the modification.
Figure 12:
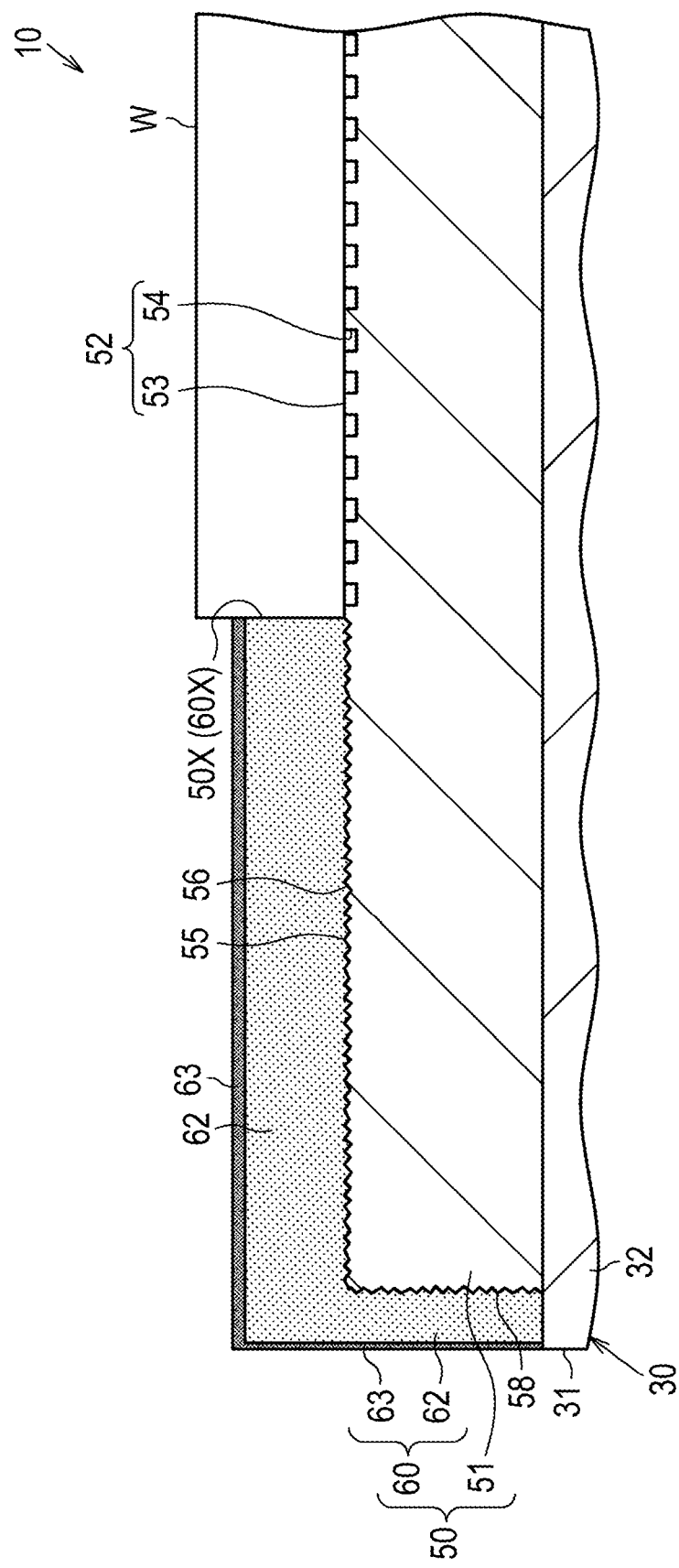
FIG. 12 is an enlarged cross-schematic sectional view illustrating a part of the substrate fixing device according to the modification.

As illustrated in FIGS. 11 and 12, the coating film layer 60 may be formed in a multilayer structure in which the coating film 62 and the coating film 63 are laminated in this order. That is, the coating film 61 (see FIG. 4) may be omitted from the coating film layer 60. In the coating film layer 60 illustrated in FIG. 11, the coating film 62 is formed to cover the roughened surface 55, and the coating film 63 is formed to cover the upper surface of the coating film 62. The coating film 62 according to the present modification is formed in close contact with the roughened surface 55. In the coating film layer 60 illustrated in FIG. 12, the coating film 62 is formed to cover the roughened surface 55 and the roughened surface 58, and the coating film 63 is formed to cover the upper surface and the side surface of the coating film 62. The coating film 62 according to the present modification is formed in close contact with the roughened surface 55 and is also formed in close contact with the roughened surface 58.

In the modification illustrated in FIGS. 10 and 12, the thickness of the portion of the coating film layer 60 covering the side surface of the bottom plate portion 51 is smaller than the thickness of the portion of the coating film layer 60 covering the upper surface of the bottom plate portion 51, but the present invention is not limited thereto. For example, the thickness of the portion of the coating film layer 60 covering the side surface of the bottom plate portion 51 may be equal to the thickness of the portion of the coating film layer 60 covering the upper surface of the bottom plate portion 51.

In the modification illustrated in FIGS. 10 and 12, the layer structure of the coating film layer 60 in the portion covering the upper surface of the bottom plate portion 51 and the layer structure of the coating film layer 60 in the portion covering the side surface of the bottom plate portion 51 are formed in the same layer structure, but the present invention is not limited thereto. For example, the layer structure of the coating film layer 60 in the portion covering the upper surface of the bottom plate portion 51 and the layer structure of the coating film layer 60 in the portion covering the side surface of the bottom plate portion 51 may be formed in different layer structures. For example, the layer structure of the coating film layer 60 in the portion covering the upper surface of the bottom plate portion 51 may be formed into a three-layer structure of the coating films 61, 62, and 63, and the layer structure of the coating film layer 60 in the portion covering the side surface of the bottom plate portion 51 may be formed into a two-layer structure of the coating films 62 and 63.

In the above embodiment, the tray 50 is configured to accommodate three substrates W. That is, the tray 50 has three accommodation recesses 50X that respectively accommodate the three substrates W. However, the number of accommodation recesses 50X of the tray 50 is not particularly limited. For example, the number of the accommodation recesses 50X of the tray 50 may be one or two, or four or more.

Figure 13:
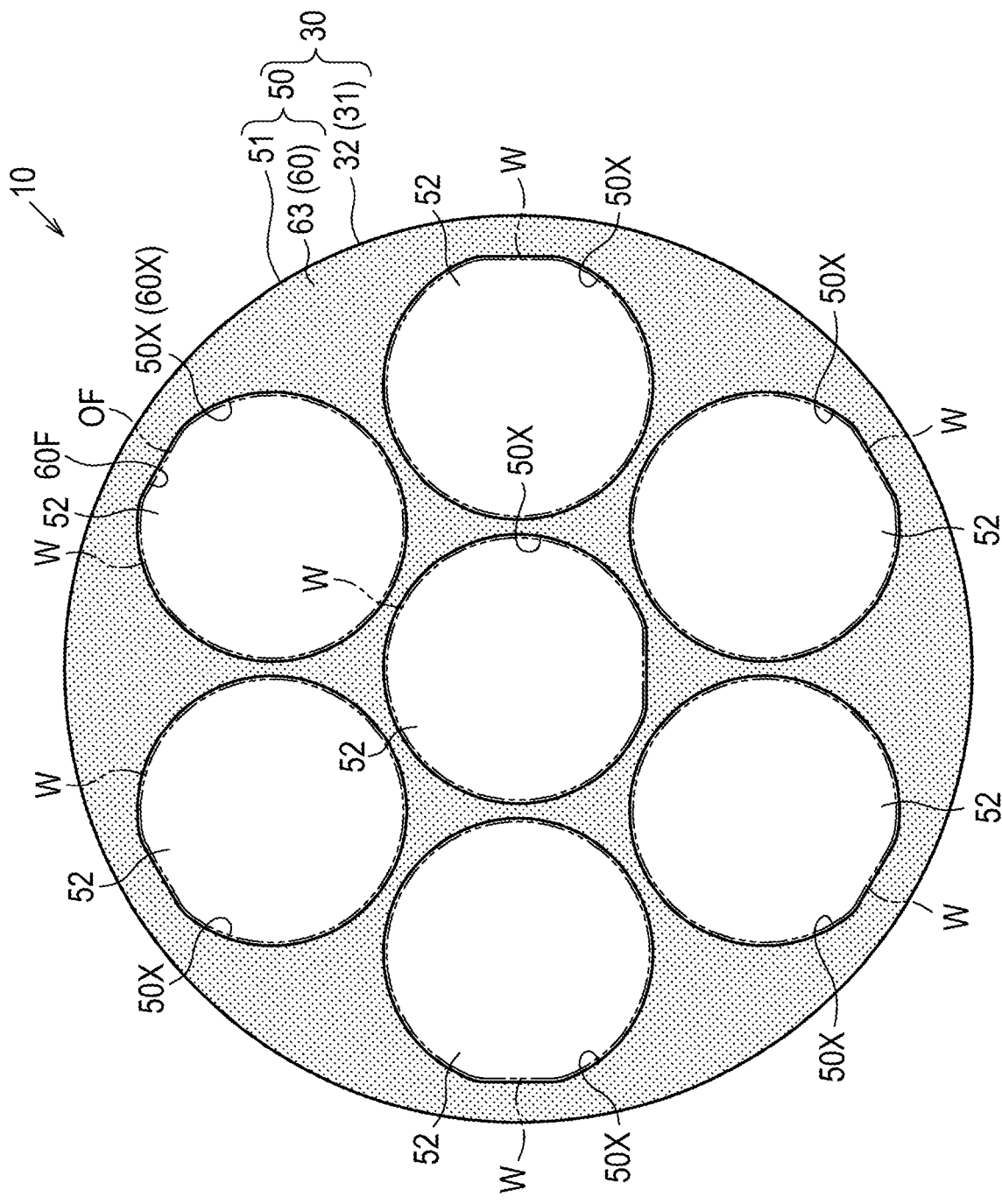
FIG. 13 is a schematic plan view illustrating the substrate fixing device according to the modification.

For example, as illustrated in FIG. 13, the tray 50 of the substrate fixture 30 may have seven accommodation recesses 50X. The substrate fixture 30 in this case can simultaneously accommodate and fix the seven substrates W.

A planar shape of the accommodation recess 50X of the tray 50 in the above embodiment is not particularly limited. The planar shape of the accommodation recess 50X is formed in the same shape as the planar shape of the substrate W accommodated in the accommodation recess 50X.

Figure 14:
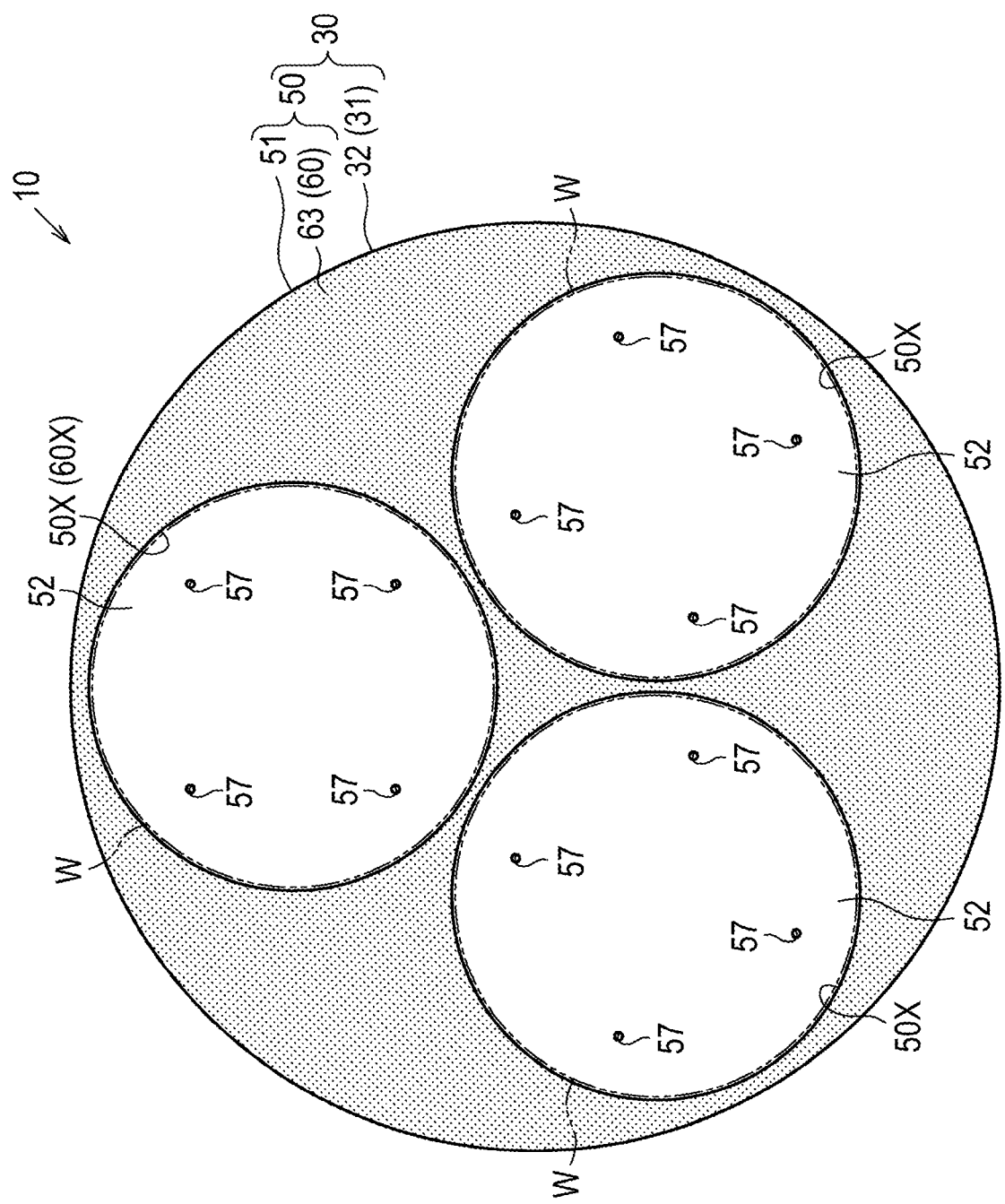
FIG. 14 is a schematic plan view illustrating the substrate fixing device according to the modification.

For example, as illustrated in FIG. 14, when the planar shape of the substrate W is a perfect circular shape having no orientation flat OF, the planar shape of the accommodation recess 50X (opening portion 60X) of the tray 50 is formed in a perfect circular shape.

Figure 15:
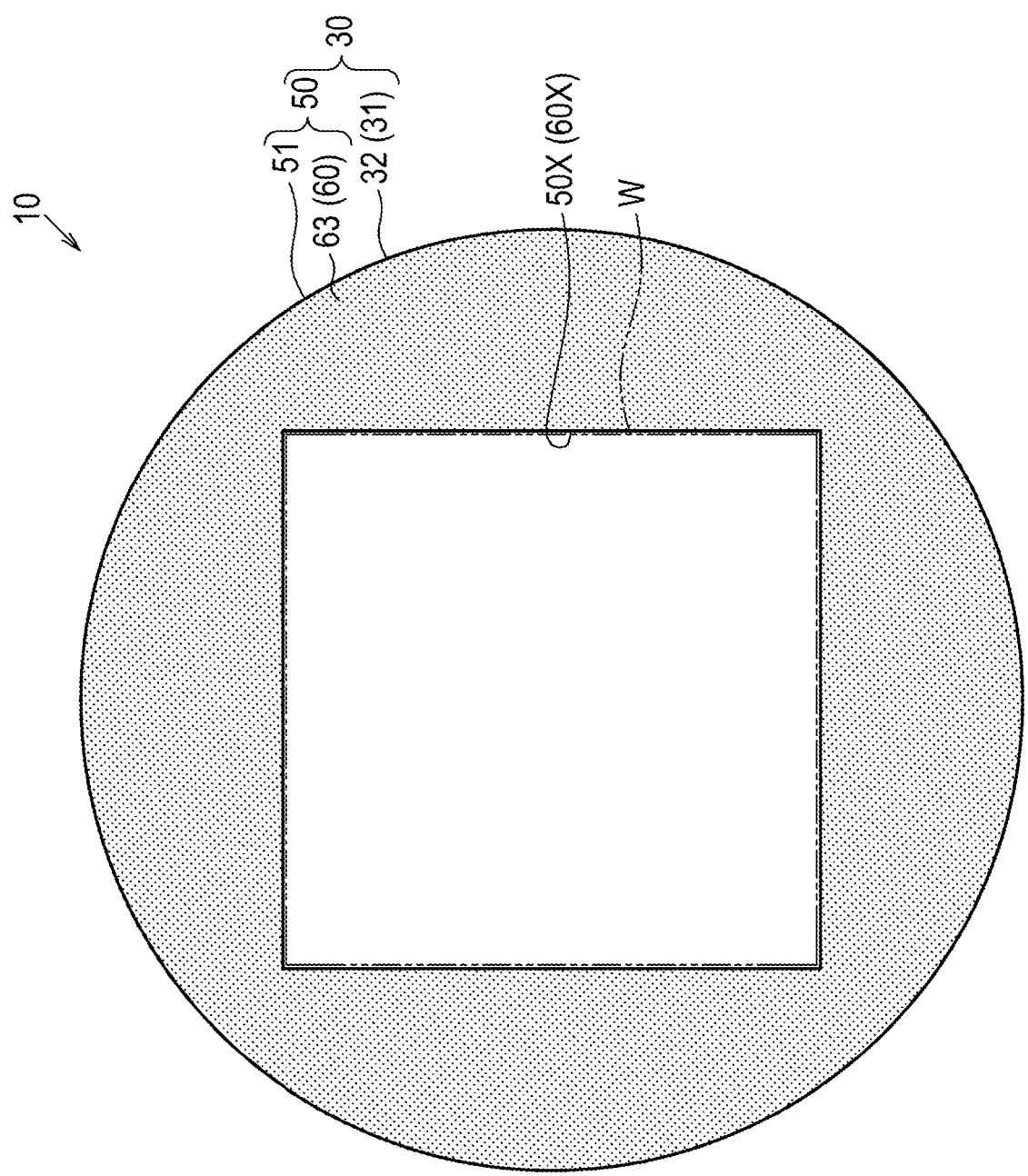
FIG. 15 is a schematic plan view illustrating the substrate fixing device according to the modification.
Figure 16:
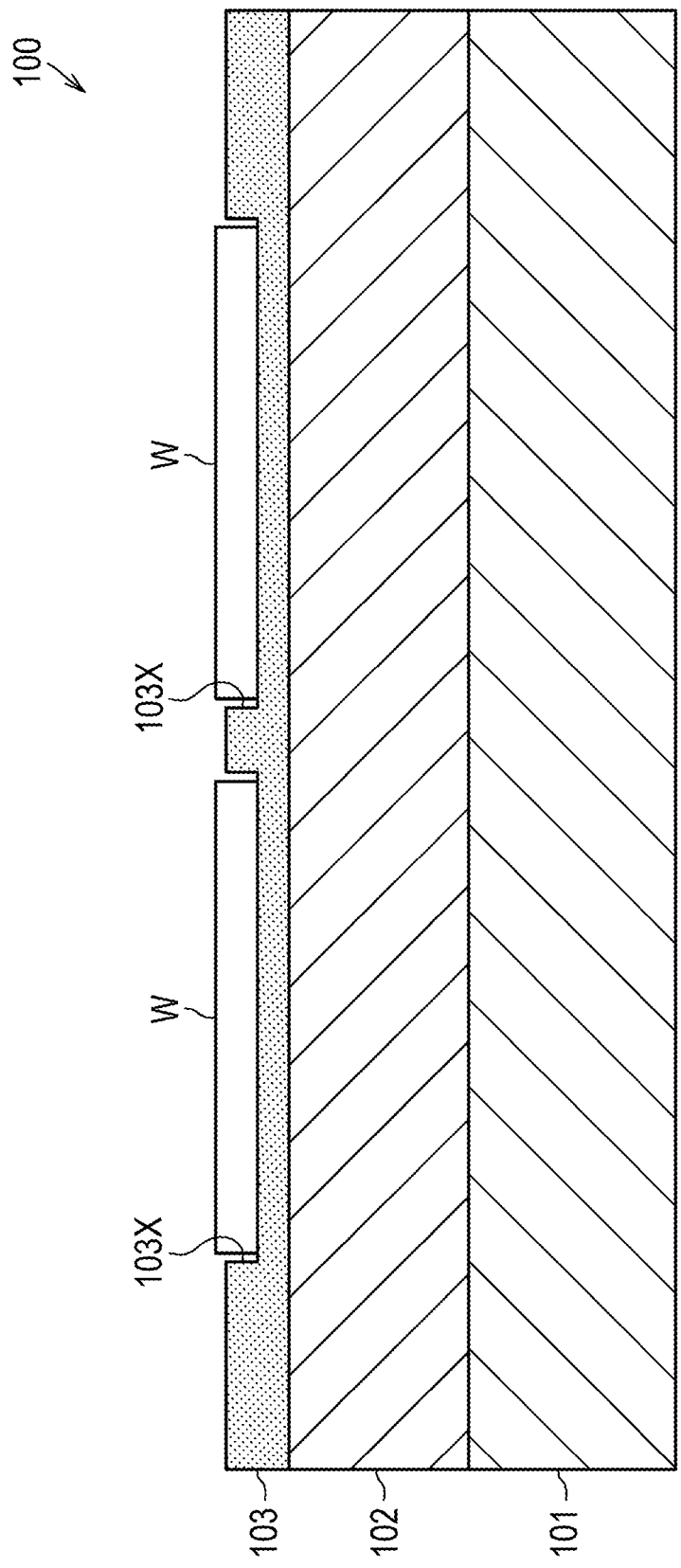
FIG. 16 is a schematic cross-sectional view illustrating a substrate fixing device of the related art.
Figure 17:
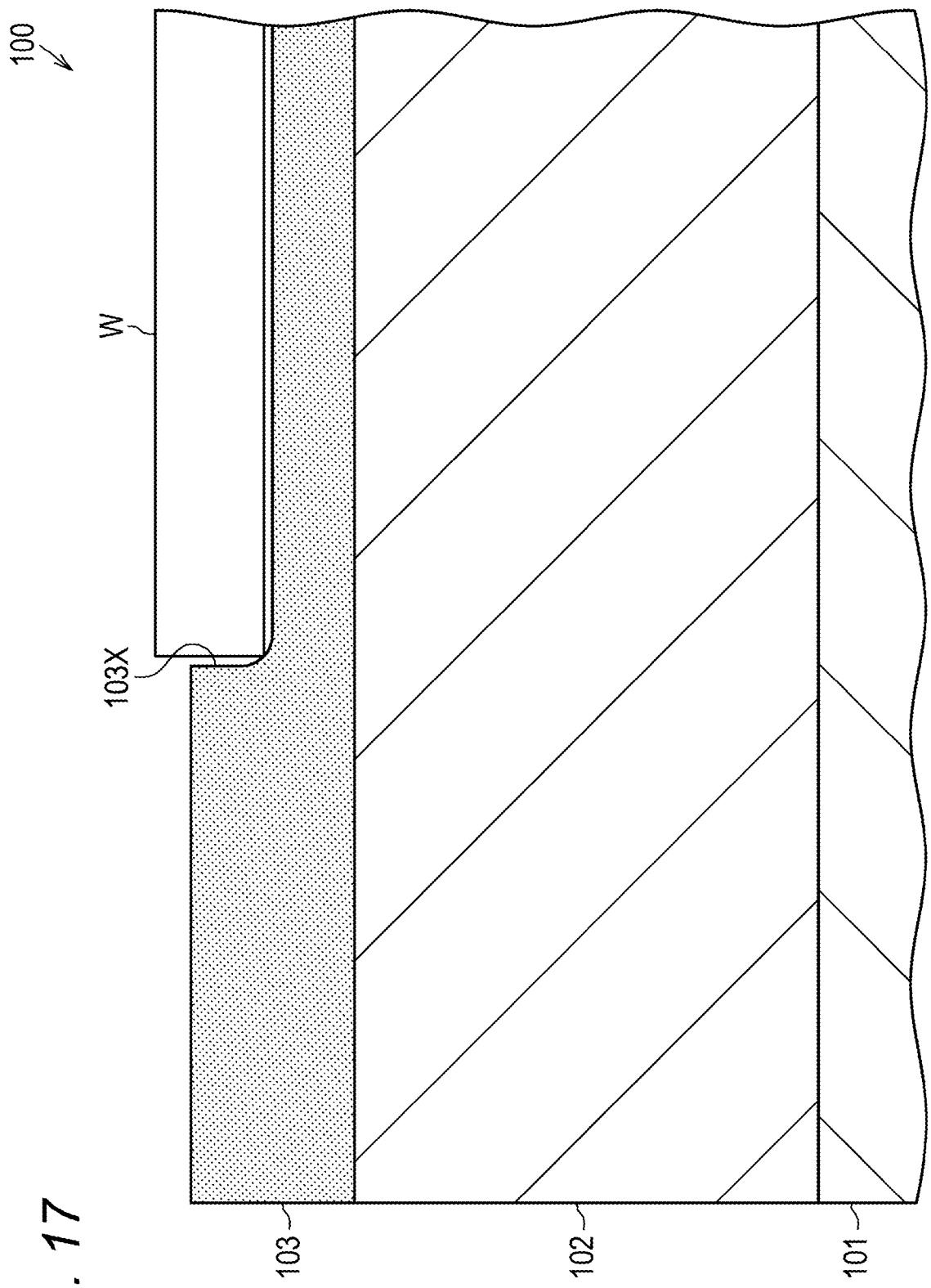
FIG. 17 is an enlarged schematic cross-sectional view illustrating a part of the substrate fixing device of the related art.

For example, as illustrated in FIG. 15, when the planar shape of the substrate W is a rectangular, the planar shape of the accommodation recess 50X (opening portion 60X) of the tray 50 is formed in a rectangular shape. The substrate fixture 30 according to the present modification can accommodate and fix only one substrate W.

In the above embodiment and modification, the portions of the surfaces of the bottom plate portion 51 on which the coating film layer 60 is formed are formed as the roughened surfaces 55 and 58, but the formation of the roughened surfaces 55 and 58 may be omitted. In this case, for example, the coating film layer 60 is formed on the surface of the bottom plate portion 51 which is a smooth surface.

In the above embodiment, the plurality of embossed portions 53 and the plurality of recesses 54 are formed in the substrate placement portion 52, but the formation of the embossed portions 53 and the recesses 54 may be omitted.

In the above embodiment, the total thickness of the coating film layer 60 is smaller than the thickness of the substrate W, but the present invention is not limited thereto. For example, the total thickness of the coating film layer 60 may be equal to the thickness of the substrate W or may be larger than the thickness of the substrate W.

In the above embodiment, the same mask member 70 is used as the mask member for roughening the upper surface of the bottom plate portion 51 and the mask member for forming the coating film layer 60, but the present invention is not limited thereto. For example, the mask member for roughening the upper surface of the bottom plate portion 51 may be different from the mask member for forming the coating film layer 60.

In the above embodiment, the substrate fixing device 10 is applied to the semiconductor manufacturing device 1 which is a plasma etching device, but a process in which the substrate fixing device 10 is used is not particularly limited. For example, the substrate fixing device 10 may be used in a process such as CVD.

What is claimed is:

1. A tray mounted on an electrostatic chuck, the tray comprising:
    an accommodation recess configured to accommodate a substrate;
    a bottom plate portion placed on the electrostatic chuck;
    a coating film layer made of a material different from the bottom plate portion and formed on an upper surface of the bottom plate portion; and
    an opening portion penetrating the coating film layer in a thickness direction,
    wherein the accommodation recess includes an inner side surface of the opening portion and an upper surface of the bottom plate portion exposed from the opening portion,
    wherein the coating film layer has a multilayer structure including a first coating film having higher plasma resistance than the bottom plate portion and a second coating film laminated on an upper surface of the first coating film and having higher plasma resistance than the first coating film, and
    wherein the first coating film is thicker than the second coating film.

2. The tray according to claim 1,
    wherein the second coating film has a higher density than the first coating film.

3. The tray according to claim 1,
    wherein the first coating film is a thermal spray film, and
    wherein the second coating film is a PVD film.

4. The tray according to claim 1,
    wherein the coating film layer further includes a third coating film formed on an upper surface of the bottom plate portion,
    wherein the first coating film is laminated on an upper surface of the third coating film,
    wherein the third coating film has higher plasma resistance than the first coating film, and
    wherein the third coating film is thinner than the first coating film.

5. The tray according to claim 4,
    wherein the third coating film has a higher density than the first coating film, and
    wherein the third coating film is a PVD film.

6. The tray according to claim 1,
    wherein the upper surface of the bottom plate portion has a roughened surface having a surface roughness larger than that of a lower surface of the bottom plate portion, and
    wherein the coating film layer is formed to cover the roughened surface.

7. The tray according to claim 6,
    wherein the upper surface of the bottom plate portion has a substrate placement portion exposed from the opening portion,
    wherein the substrate placement portion includes a plurality of embossed portions and a plurality of first recesses, and
    wherein a second recess constituting the roughened surface is shallower than the first recess.

8. The tray according to claim 1,
    wherein the coating film layer is formed to cover a side surface of the bottom plate portion.

9. The tray according to claim 1,
    wherein the coating film layer has a plurality of the opening portions for accommodating a plurality of the substrates, respectively.

10. A substrate fixing device comprising:
    a conductive base plate;
    an electrostatic chuck fixed to an upper surface of the base plate; and
    a tray including an accommodation recess configured to accommodate a substrate and mounted on an upper surface of the electrostatic chuck, wherein the tray includes
- a bottom plate portion placed on the upper surface of the electrostatic chuck,
- a coating film layer made of a material different from the bottom plate portion and formed on an upper surface of the bottom plate portion, and
- an opening portion penetrating the coating film layer in a thickness direction, wherein the accommodation recess includes an inner side surface of the opening portion and an upper surface of the bottom plate portion exposed from the opening portion, wherein the coating film layer has a multilayer structure including a first coating film having higher plasma resistance than the bottom plate portion and a second coating film laminated on an upper surface of the first coating film and having higher plasma resistance than the first coating film, and wherein the first coating film is thicker than the second coating film.

* * * * *